United States Patent
Kousai et al.

(10) Patent No.: US 7,317,363 B2
(45) Date of Patent: Jan. 8, 2008

(54) FREQUENCY SYNTHESIZER

(75) Inventors: Shouhei Kousai, Kawasaki (JP);
Hiroyuki Kobayashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 11/304,594

(22) Filed: Dec. 16, 2005

(65) Prior Publication Data

US 2006/0158264 A1 Jul. 20, 2006

(30) Foreign Application Priority Data

Dec. 22, 2004 (JP) ............................. 2004-371097

(51) Int. Cl.
*H03B 1/00* (2006.01)

(52) U.S. Cl. ............ 331/177 V; 331/167; 331/117 FE; 331/117 R; 331/36 C; 331/176

(58) Field of Classification Search ............ 331/177 V, 331/117 FE, 167, 117 R, 36 C, 176
See application file for complete search history.

(56) References Cited

U.S. PATENT DOCUMENTS

| 6,323,736 | B2 | 11/2001 | Jansson |
| 6,388,536 | B1 | 5/2002 | Welland |
| 6,803,829 | B2 * | 10/2004 | Duncan et al. ............... 331/34 |
| 7,221,234 | B2 * | 5/2007 | Chien ............... 331/177 V |

2006/0158264 A1 7/2006 Kousai et al.

FOREIGN PATENT DOCUMENTS

JP 2002-280901 9/2002

OTHER PUBLICATIONS

U.S. Appl. No. 11/735,559 filed Apr. 16, 2007, Kobayashi et al.

* cited by examiner

*Primary Examiner*—Arnold Kinkead
(74) *Attorney, Agent, or Firm*—Oblon, Spivak, McClelland, Maier & Neustadt, P.C.

(57) ABSTRACT

There is provided a phase locked loop circuit which receives a reference signal having a reference frequency and a first signal having a first frequency, compares phases of the reference signal and first signal, applies a control voltage based on a phase comparison result to an input terminal of a voltage controlled oscillator to generate a second signal having an oscillation frequency and output the second signal from an output terminal, and supplies the second signal to a divider to divide the frequency of the second signal and output the first signal; and a controller which generates and supplies a control signal to the voltage controlled oscillator, wherein the voltage controlled oscillator has an arrangement in which a coil and variable capacitance are connected in parallel between the input terminal and output terminal, and one of a plurality of capacitances is selectively connected between the input terminal and output terminal by a switch in parallel with the variable capacitance, and ON/OFF of the switch is controlled by the control signal.

11 Claims, 22 Drawing Sheets

FIG. 11

(a) 13MHz (26MHz)

| mc | | ※1 | ※2 | ※3 | ※4 |
|---|---|---|---|---|---|
| 185 | 10111001 | 0 | 2399 | 2405 | |
| 185 | 10111001 | 1 | 2405.5 | 2411.5 | |
| 186 | 10111010 | 0 | 2412 | 2418 | |
| 186 | 10111010 | 1 | 2418.5 | 2424.5 | |
| TOTAL | | | 2402 | 2424.5 | 22.5 |
| 187 | 10111011 | 0 | 2425 | 2431 | |
| 187 | 10111011 | 1 | 2431.5 | 2437.5 | |
| 188 | 10111100 | 0 | 2438 | 2444 | |
| TOTAL | | | 2425 | 2444 | 19 |
| 188 | 10111100 | 1 | 2444.5 | 2450.5 | |
| 189 | 10111101 | 0 | 2451 | 2457 | |
| 189 | 10111101 | 1 | 2457.5 | 2463.5 | |
| TOTAL | | | 2444.5 | 2463.5 | 19 |
| 190 | 10111110 | 0 | 2464 | 2470 | |
| 190 | 10111110 | 1 | 2470.5 | 2476.5 | |
| 191 | 10111111 | 0 | 2477 | 2483 | |
| 191 | 10111111 | 1 | 2483.5 | 2489.5 | |
| TOTAL | | | 2464 | 2481.5 | 17.5 |

(b) 16.2MHz

| mc | | ※1 | ※2 | ※3 | ※4 |
|---|---|---|---|---|---|
| 148 | 10010110 | 0 | 2389.6 | 2397.6 | |
| 148 | 10010110 | 1 | 2397.7 | 2405.7 | |
| 149 | 10010101 | 0 | 2405.8 | 2413.8 | |
| 149 | 10010101 | 1 | 2413.9 | 2421.9 | |
| TOTAL | | | 2402 | 2421.5 | 19.5 |
| 150 | 10010110 | 0 | 2422 | 2430 | |
| 150 | 10010110 | 1 | 2430.1 | 2438.1 | |
| TOTAL | | | 2422 | 2438 | 16 |
| 151 | 10010111 | 0 | 2438.2 | 2446.2 | |
| 151 | 10010111 | 1 | 2446.3 | 2454.3 | |
| 152 | 10011000 | 0 | 2454.4 | 2462.4 | |
| TOTAL | | | 2438.5 | 2462 | 23.5 |
| 152 | 10011000 | 1 | 2462.5 | 2470.5 | |
| 153 | 10011001 | 0 | 2470.6 | 2478.6 | |
| 153 | 10011001 | 1 | 2478.7 | 2486.7 | |
| TOTAL | | | 2462.5 | 2481.5 | 19 |

(c) 19.2MHz

| mc | | ※1 | ※2 | ※3 | ※4 |
|---|---|---|---|---|---|
| 125 | 11111101 | 1 | 2400.1 | 2409.6 | |
| 126 | 11111110 | 0 | 2409.7 | 2419.2 | |
| TOTAL | | | 2402 | 2419 | 17 |
| 126 | 11111110 | 1 | 2419.3 | 2428.8 | |
| 127 | 11111111 | 0 | 2428.9 | 2438.4 | |
| TOTAL | | | 2419.5 | 2438 | 18.5 |
| 127 | 11111111 | 1 | 2438.5 | 2448 | |
| 128 | 00000000 | 0 | 2448.1 | 2457.6 | |
| TOTAL | | | 2438.5 | 2457.5 | 19 |
| 128 | 10000000 | 1 | 2457.7 | 2467.2 | |
| 129 | 10000000 | 0 | 2467.3 | 2476.8 | |
| 129 | 10000000 | 1 | 2476.9 | 2486.4 | |
| TOTAL | | | 2458 | 2481.5 | 23.5 |

※1 PLUS(1)/MINUS(0)
※2 MINIMUM FREQUENCY
※3 MAXIMUM FREQUENCY
※4 FREQUENCY RANGE

FREQUENCY SYNTHESIZER

CROSS REFERENCE TO RELATED APPLICATION

This application is based upon and claims benefit of priority under 35 USC §119 from the Japanese Patent Application No. 2004-371097, filed on Dec. 22, 2004, the entire contents of which are incorporated herein by reference.

BACKGROUND OF THE INVENTION

The present invention relates to a frequency synthesizer and, more particularly, to a frequency synthesizer having a phase locked loop (to be referred to as a PLL hereinafter).

The PLL is used to allow a voltage controlled oscillator (to be referred to as a VCO hereinafter) to oscillate at a predetermined frequency.

The PLL cannot oscillate over a wide frequency range if a slope KV of an F-V curve which indicates the relationship between a frequency F and control voltage Vctrl is small, i.e., if the gain is small.

Also, the F-V curve generally varies in accordance with, e.g., the temperature or manufacturing conditions. Therefore, the PLL cannot oscillate at a desired frequency or frequency range in some cases.

Furthermore, if the slope KV is small, the lockup time required before the PLL locks prolongs.

On the other hand, if the slope KV is increased, the stability of the PLL deteriorates. In addition, increasing the slope KV increases the current consumption and the apparatus area. Conventionally, therefore, increasing the slope KV is also a problem.

Moreover, the slope KV depends on the control voltage Vctrl. Therefore, if the control voltage Vctrl changes, the oscillation frequency F also changes, and this changes the slope KV. Accordingly, a frequency range in which oscillation within the range of the desired control voltage Vctrl is possible is narrow.

References disclosing the conventional frequency synthesizers are as follows.
1: Japanese Patent Laid-Open No. 2002-280901
2: U.S. Pat. No. 6,323,736
3: U.S. Pat. No. 6,388,536

SUMMARY OF THE INVENTION

According to one aspect of the present invention, there is provided a frequency synthesizer comprising:

a phase locked loop circuit which receives a reference signal having a reference frequency and a first signal having a first frequency, compares phases of the reference signal and first signal, applies a control voltage based on a phase comparison result to an input terminal of a voltage controlled oscillator to generate a second signal having an oscillation frequency and output the second signal from an output terminal, and supplies the second signal to a divider to divide the frequency of the second signal and output the first signal; and a controller which generates and supplies a control signal to the voltage controlled oscillator, wherein the voltage controlled oscillator has an arrangement in which a coil and variable capacitance are connected in parallel between the input terminal and output terminal, and one of a plurality of capacitances is selectively connected between the input terminal and output terminal by a switch in parallel with the variable capacitance, and ON/OFF of the switch is controlled by the control signal.

According to one aspect of the present invention, there is provided a frequency synthesizer comprising:

a phase locked loop circuit having a phase comparator which receives a reference signal having a reference frequency and a first signal having a first frequency, compares phases of the reference signal and first signal, and outputs a phase comparison result, a charge pump which generates and outputs a control voltage based on the phase comparison result, a loop filter which removes high-frequency noise contained in the control voltage, a voltage controlled oscillator which receives, at an input terminal, the control voltage output from the loop filter, and outputs, from an output terminal, a second signal having an oscillation frequency F corresponding to a level of the control voltage, and a divider which receives the second signal, divides the frequency of the second signal by a frequency dividing ratio N (N>0), and outputs the first signal having the first frequency F/N; and a controller which generates and supplies a control signal to the voltage controlled oscillator, wherein the voltage controlled oscillator has an arrangement in which, between the input terminal and output terminal,
a coil having two ends connected in series,
a variable capacitance having two ends connected in series,
a first capacitance unit in which a first capacitance and first switch are connected in series,
a second capacitance unit in which a second capacitance and second switch are connected in series,
. . .
an nth (n is an integer of not less than 2) capacitance unit in which an nth capacitance and nth switch are connected in series,
are connected in parallel with each other, and
ON/OFF of each of the first, second, . . . , nth switches is controlled by the control signal.

BRIEF DESCRIPTION OF THE DRAWINGS

FIG. 11 is a view for explaining command signals and obtained frequency ranges in the same frequency synthesizer;

DETAILED DESCRIPTION OF THE INVENTION

Embodiments of the present invention will be described below with reference to the accompanying drawings.

(1) FIRST EMBODIMENT

Figure 2:
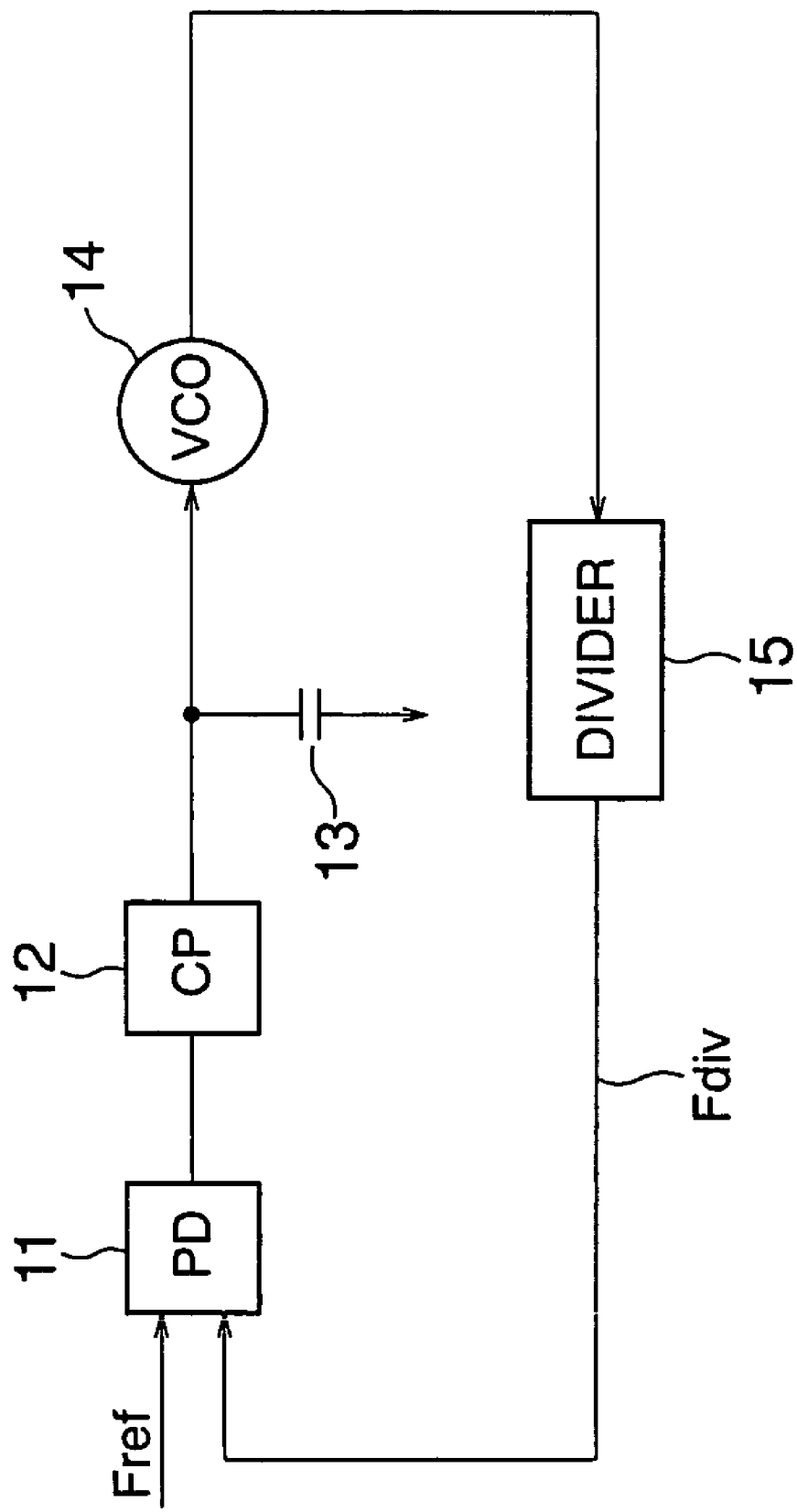
FIG. 2 is a circuit diagram showing the arrangement of a frequency synthesizer according to a comparative example.

FIG. 2 shows the arrangement of a PLL as a comparative example.

A phase detector (to be referred to as a PD hereinafter) 11 compares the phase of a signal having a frequency Fdiv divided by a divider 15 having a frequency dividing ratio N (N>0) with the phase of a signal having a reference frequency Fref supplied by, e.g., a CPU (not shown) which controls the whole system. The phase difference of the frequency Fdiv from the reference frequency Fref is output as the comparison result.

On the basis of this comparison result, a charge pump (to be referred to as a CP hereinafter) 12 charges or discharges the output terminal, and outputs a control voltage Vctrl based on the comparison result. A loop filter 13 which ensures the stability of the loop is inserted between this output terminal and the ground terminal.

A VCO 14 is given the control voltage Vctrl output from the CP 12, and outputs an oscillation frequency Fvco based on this voltage.

The divider 15 divides the oscillation frequency Fvco at the frequency dividing ratio N (N>0), and outputs the frequency Fdiv (=Fvco/N).

Consequently, the PLL locks while the oscillation frequency Fvco/N is equal to the reference frequency Fref.

Figure 3:
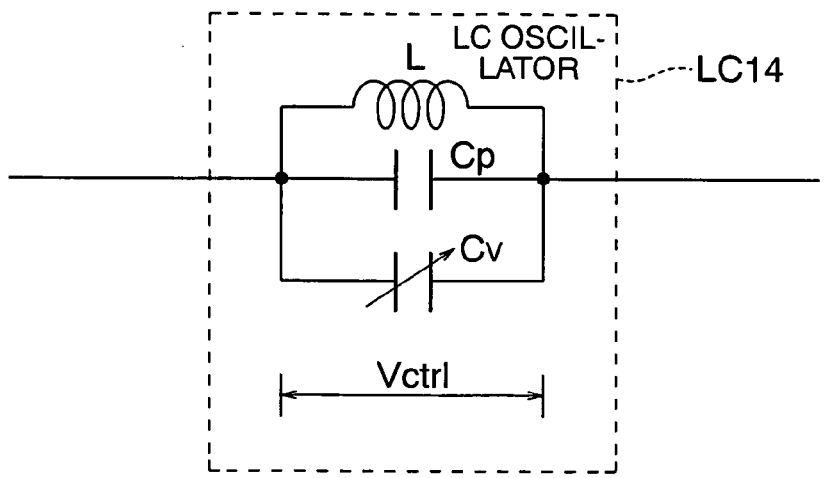
FIG. 3 is a circuit diagram showing the arrangement of an LC oscillator in the same frequency synthesizer.

Note that, as shown in FIG. 3, the VCO 14 incorporates an LC oscillator LC14 in which a variable capacitance Cv which changes its capacitance in accordance with the control voltage Vctrl, a parasitic capacitance Cp which is the total of parasitic capacitances, e.g., the parasitic capacitance and wiring capacitance of a transistor, of the VCO 14, and a coil L are connected in parallel.

In this case, the oscillation frequency Fvco is $$Fvco = 1/(2\pi \cdot (L \cdot (Cv + Cp))^{1/2}) \tag{1}$$

If the parasitic capacitance Cp is larger than the variable capacitance Cv, the overall oscillator frequency Fvco cannot be changed much even when the variable capacitance Cv is adjusted. That is, oscillation cannot be performed over a wide frequency range.

Figure 4:
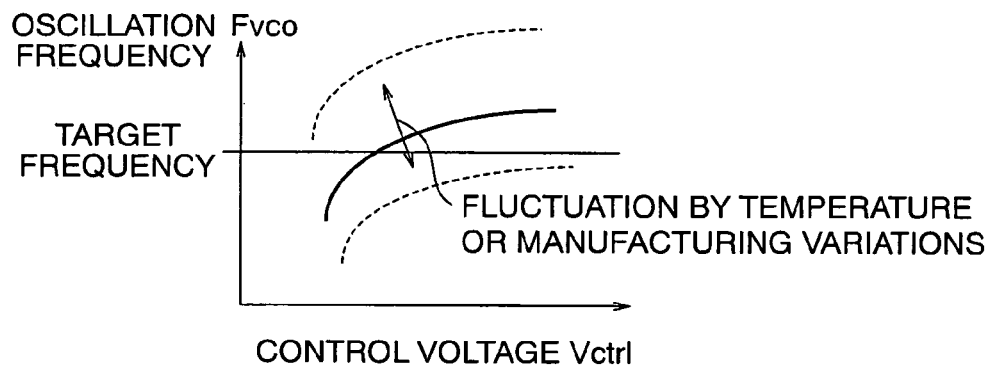
FIG. 4 is a graph showing fluctuations of the F-V curve of the same frequency synthesizer caused by the temperature or manufacturing variations.

F-V curves indicating the relationship between the oscillation frequency Fvco of the PLL and the control voltage Vctrl in this comparative example are as shown in FIG. 4. As described above, the F-V curve fluctuates in accordance with variations in, e.g., temperature and manufacturing process conditions.

Figure 5:
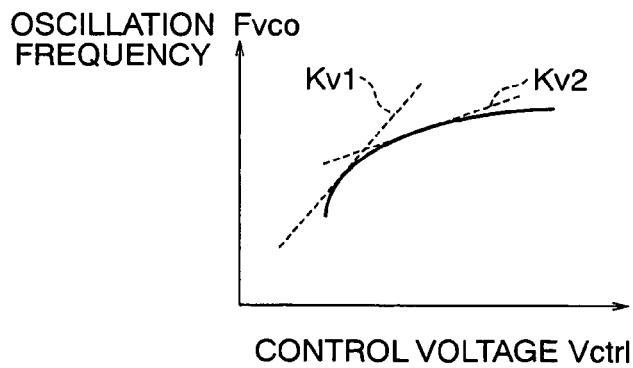
FIG. 5 is a graph showing the slopes of the same F-V curve.

Also, as shown in FIG. 5, a slope KV1 or KV2 of the F-V curve depends on the control voltage Vctrl. If the slope is as large as the slope KV1, the loop becomes unstable. If the slope is as small as the slope KV2, the lockup time of the PLL prolongs. A frequency range within which the VCO 14 oscillates at a desired slope KV is narrow.

Figure 1:
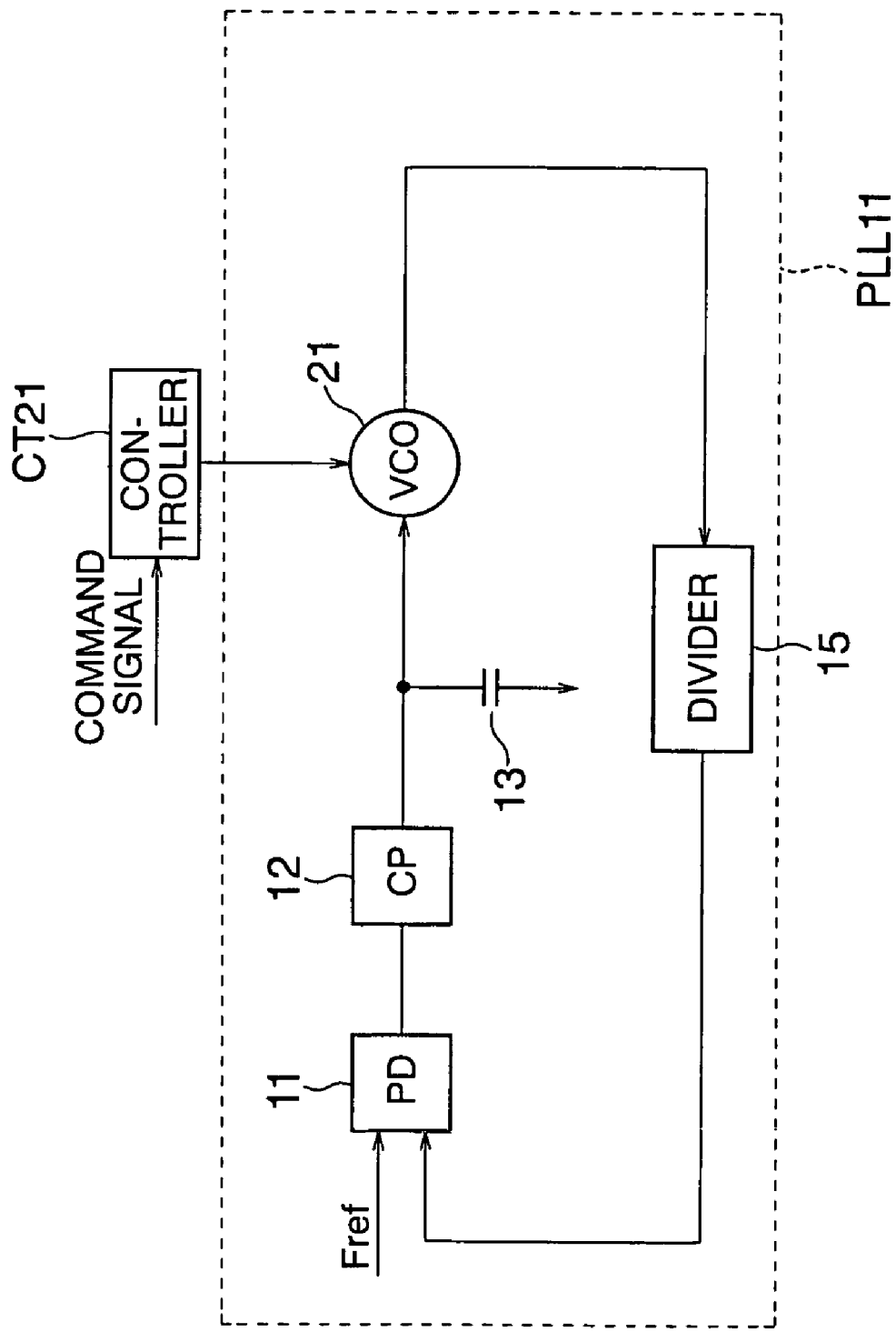
FIG. 1 is a circuit diagram showing the arrangement of a frequency synthesizer according to the first embodiment of the present invention.

By contrast, a frequency synthesizer according to this embodiment has an arrangement shown in FIG. 1. The arrangement of a VCO 21 differs from that of the frequency synthesizer according to the comparative example. Also, a controller CT21 which gives the VCO 21 a control signal for controlling ON/OFF of switches (to be described later) is added. The controller CT21 is given a command signal from a CPU (not shown) or the like.

Figure 6:
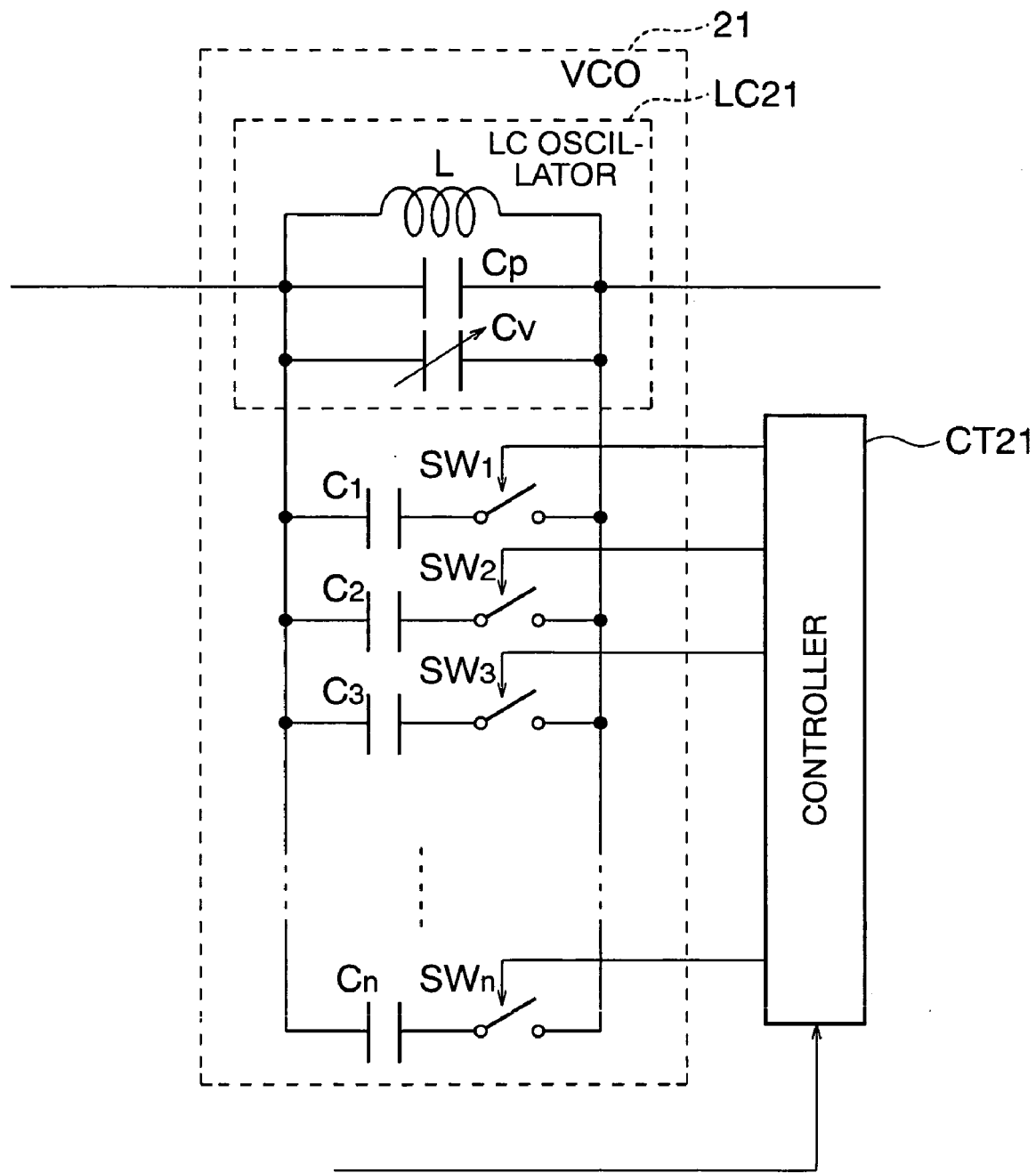
FIG. 6 is a circuit diagram showing an example of the arrangement of the LC oscillator in the frequency synthesizer according to the first embodiment.

As shown in FIG. 6, the VCO 21 has an arrangement, as an LC oscillator, in which a series circuit of a capacitance C1 and switch SW1, a series circuit of a capacitance C2 and switch SW2, a series circuit of a capacitance C3 and switch SW3, . . . , and a series circuit of a capacitance Cn (n is an integer of 2 or more) and switch SWn are connected in parallel with the two terminals of a conventional LC oscillator LC21.

ON/OFF of each of the switches SW1 to SWn is controlled by a control signal from the controller CT21.

Figure 7:
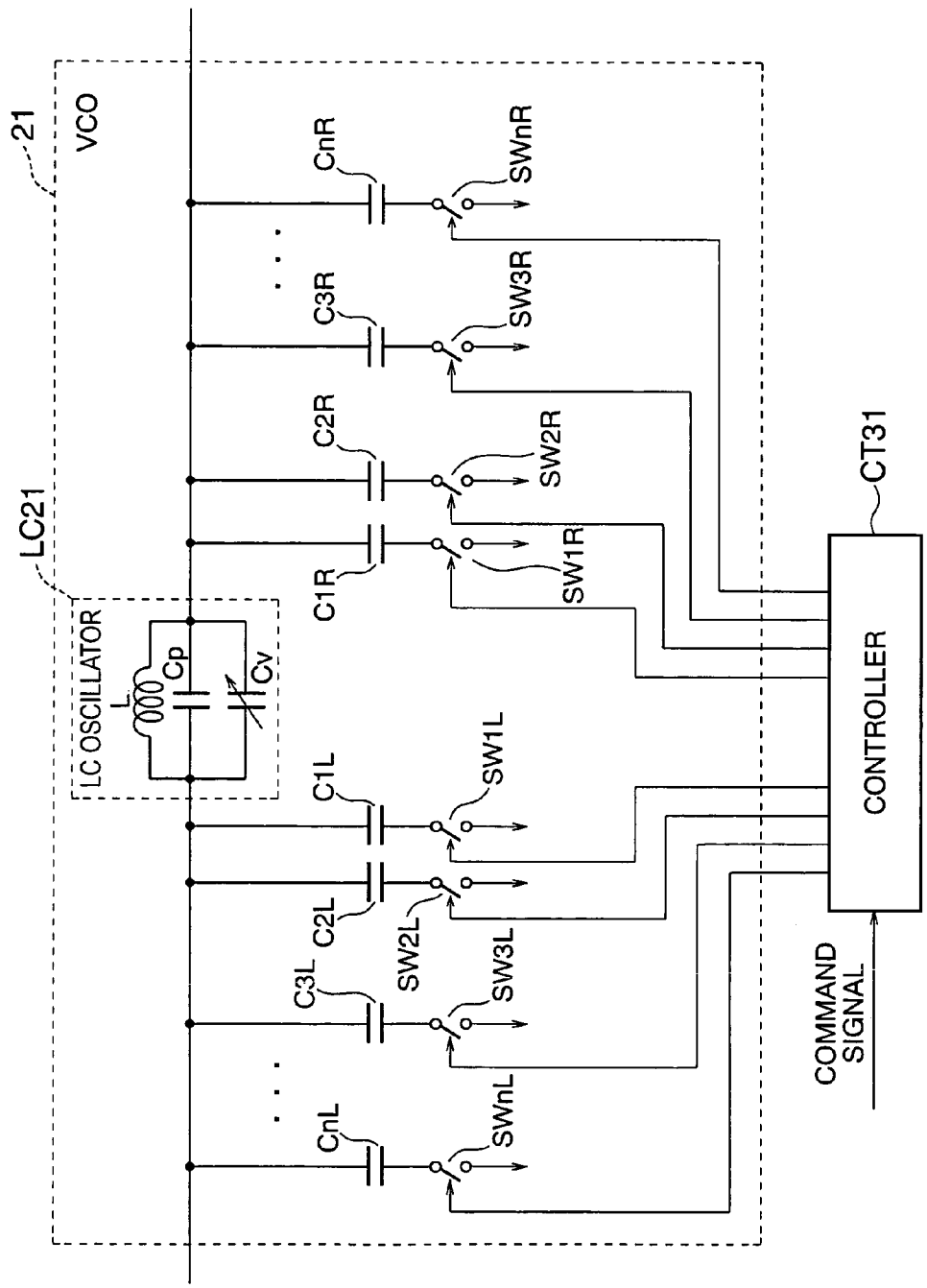
FIG. 7 is a circuit diagram showing another example of the arrangement of the LC oscillator in the same frequency synthesizer.

Alternatively, the VCO 21 has an arrangement as shown in FIG. 7.

The VCO 21 has an arrangement in which a series circuit of a capacitance C1L and switch SW1L, a series circuit of a capacitance C2L and switch SW2L, a series circuit of a capacitance C3L and switch SW3L, . . . , and a series circuit of a capacitance CnL and switch SWnL are connected in parallel with one terminal of a conventional LC oscillator LC21 and the ground terminal, and an arrangement in which a series circuit of a capacitance C1R and switch SW1R, a series circuit of a capacitance C2R and switch SW2R, a series circuit of a capacitance C3R and switch SW3R, . . . , and a series circuit of a capacitance CnR and switch SWnR are connected in parallel with the other terminal of the LC oscillator LC21 and the ground terminal.

ON/OFF of each of the switches SW1L to SWnL and SW1R to SWnR is controlled by a control signal from a controller CT31. Note that when a switch SWjL ($1 \leq j \leq n$) is turned on, a switch SWjR is also turned on, and, when the switch SWjL is OFF, the switch SWjR is also OFF.

When 2Cn=CnR=CnL, the oscillation circuits of the VCOs shown in FIGS. 6 and 7 are equivalent.

Assume that a value indicating which capacitance is to be added to the variable capacitance Cv by setting ON/OFF of the switches is a trimming value.

Figure 8:
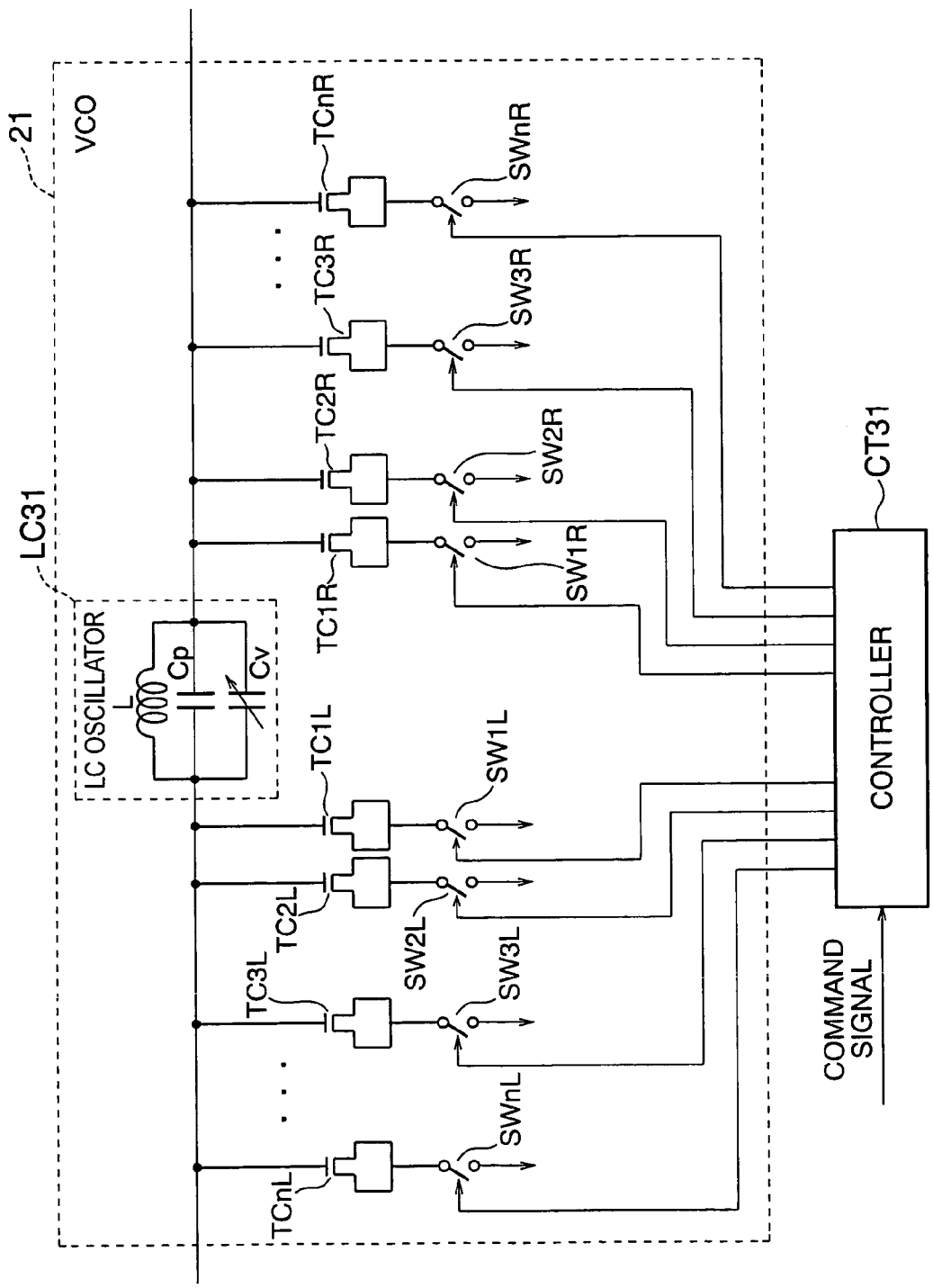
FIG. 8 is a circuit diagram showing still another example of the arrangement of the LC oscillator in the same frequency synthesizer.

As shown in FIG. 8, the capacitances C1L to CnL and C1R to CnR may also be replaced with gate capacitances TC1L to TCnL and TC1R to TCnR present between the gates and terminals shortcircuiting the sources and drains of MOS transistors or MIS transistors. Similarly, gate capacitances present between the gates and terminals shortcircuiting the sources and drains of MOS transistors or MIS transistors may also be used as the capacitances C1 to Cn in the arrangement shown in FIG. 6.

For example, oscillation can be performed over a broader frequency range when the capacitances C1 to Cn shown in FIG. 6 have the following relationship $$C2=2 \cdot C1, C3=2 \cdot C2, C4=2 \cdot C3, \quad (2)$$

That is, $$Cj=2 \cdot Cj-1 \quad (3)$$

where $0 \leq j \leq n$.

In addition, letting S0 be a capacitance when none of the capacitances C1 to Cn is added, S1 be a capacitance when the capacitance C1 alone is added, S2 be a capacitance when the capacitances C1 and C2 are added, and Sn be a capacitance when all the capacitances C1 to Cn are added, we have $$S1=2^0 \cdot C1$$

$$S2=2^1 \cdot C2+2^0 \cdot C1$$

. . .

$$Sn=2^{n-1} \cdot Cn+2^{n-2} \cdot Cn-1+ \ldots +2^1 \cdot C2+2^0 \cdot C1 \quad (4)$$

The case in which the VCO 14 according to the comparative example which includes the LC oscillator LC14 shown in FIG. 3 is used is equivalent to S=0, in which case no additional capacitance is present. In this case, the oscillation frequency Fvco can be changed only by changing the variable capacitance Cv by the control voltage Vctrl.

Figure 9:
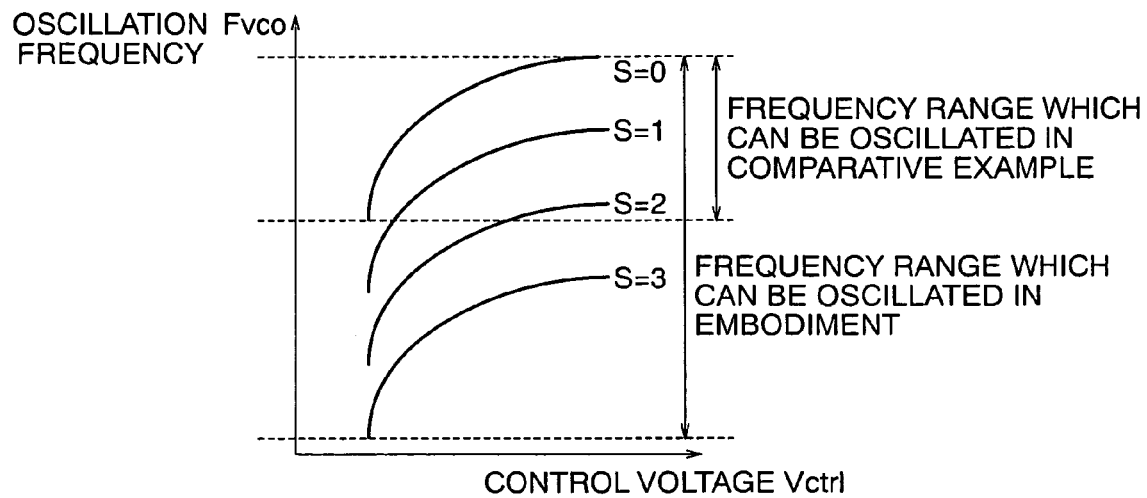
FIG. 9 is a graph showing frequency ranges which can be oscillated in the comparative example and first embodiment.

An F-V curve in this case is equivalent to curve S=0 shown in FIG. 9. In this case, a frequency range which can be oscillated is limited. Also, as indicated by, e.g., an F-V curve L1 shown in FIG. 10, only one F-V curve can be obtained. Therefore, when oscillation is to be performed within the frequency range of, e.g., 2.40 to 2.48 GHz, the control voltage Vctrl must be varied over 0.4 V from 1.05 to 1.45 V. The slope KV when the control voltage is 1.05 V largely differs from that when the control voltage is 1.45 V.

By contrast, in this embodiment as shown in FIG. 9, not only the variable capacitance Cv is adjusted, but also the capacitances C1 to Cn shown in FIG. 6, the capacitances C1L to CnL and C1R to CnR shown in FIG. 7, or the capacitances TC1L to TCnL and TC1R to TCnR shown in FIG. 8 are selectively added in parallel with the variable capacitance Cv. A frequency range which can be oscillated can be widened by, e.g., selecting the three types of additional capacitances S1 to S3 described above.

Figure 10:
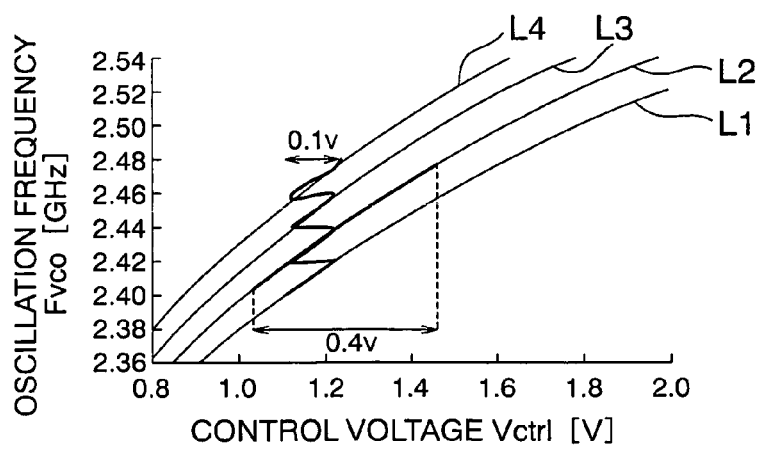
FIG. 10 is a graph showing the F-V curves of the same frequency synthesizer.

Consequently, as shown in FIG. 10, a plurality of F-V curves can be obtained as indicated by, e.g., four curves L1 to L4.

Accordingly, when oscillation is to be performed within the frequency range of, e.g., 2.40 to 2.48 GHz, the control voltage Vctrl need only be changed within a narrow range of 0.2 V from 1.1 to 1.3 V, and the slope KV can be held substantially constant.

As described above, when the oscillation frequency Fvco is to be adjusted, a command signal is supplied to the controller CT21 (CT31), and the controller CT21 outputs a control signal to determine which switch is to be turned on to add a capacitance to the variable capacitance Cv. The controller CT21 (CT31) may be formed by firmware or may be controlled by software.

For example, when the VCO 21 includes a prescaler and counter, and the control signal to be given to the VCO21 is made up of mc (the value of a main counter), num (the numerator of the counter), den (the denominator of the counter), and Fref (the reference frequency), an oscillation frequency Fout output from the VCO 21 is represented by $$Fout=mc(1+num/den)*Fref \quad (5)$$

For example, oscillation frequencies Fout obtained by using equation (5) when Fref=13, 16.2, and 19.2 MHz are shown in (a), (b), and (c), respectively, of FIG. 11. Assume that three stages of capacitances C1 to C3 can be added to the variable capacitance Cv. Referring to (a) to (c) in FIG. 11, (1) indicates a case in which all the capacitances C1 to C3 are added; (2), a case in which the two capacitances C1 and C2 are added; (3), a case in which one capacitance C1 is added; and (4), a case in which none of the capacitances C1 to C3 is added.

In "(2) the case in which the two capacitances C1 and C2 are added" in (a) of FIG. 11, for example, binary data of mc=188 is "10111100", the most significant bit of num whose plus sign indicates "1" and minus sign indicates "0" is "0", a minimum frequency is "2,438 MGz", a maximum frequency is "2,444 MGz", and a frequency range is "19 MHz".

In this embodiment as described above, oscillation can be performed over a frequency range broader than in the comparative example by supplying the control voltage Vctrl within a narrow range.

(2) SECOND EMBODIMENT

Figure 12:
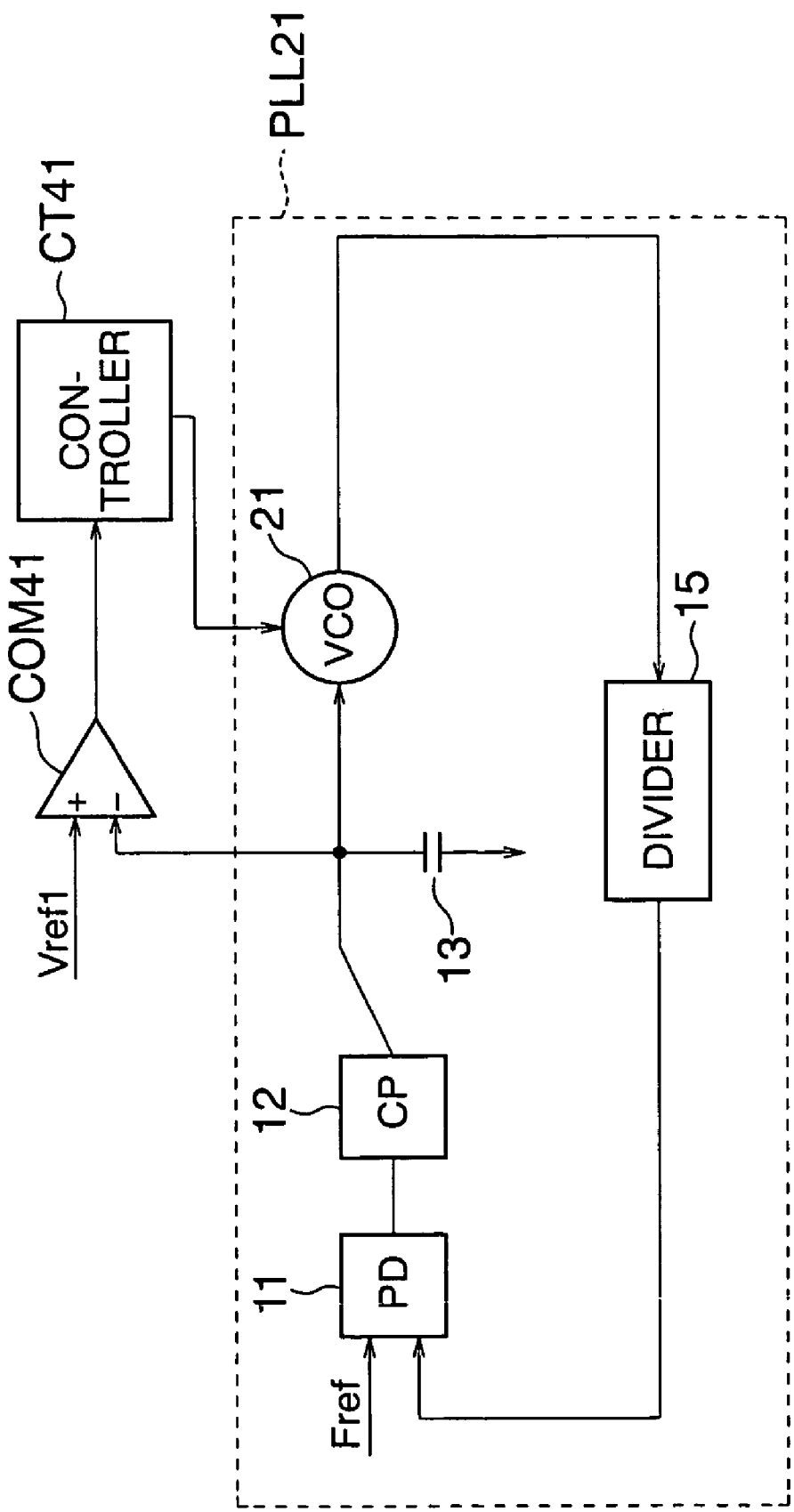
FIG. 12 is a circuit diagram showing the arrangement of a frequency synthesizer according to the second embodiment of the present invention.

A frequency synthesizer according to the second embodiment of the present invention will be described below with reference to FIG. 12 showing the arrangement of this frequency synthesizer.

In the first embodiment shown in FIG. 1, a command signal is supplied to the controller CT21 from a CPU (not shown) or the like. On the basis of this command signal, a control signal is given to the VCO 21, and ON/OFF of each of the switches SW1 to SWn contained in the VCO 21 is controlled. As a consequence, the capacitances C1 to Cn shown in FIG. 6, for example, are selectively added in parallel with the variable capacitance Cv.

By contrast, in this embodiment, a comparator COM41 compares a control voltage Vctrl, which is output from a CP 12 to a VCO 21, with a reference voltage Vref1, and supplies the comparison result to a controller CT41. On the basis of this comparison result, the controller CT41 supplies a control signal to the VCO 21. In the VCO 21, ON/OFF of each of internal switches SW1 to SWn is controlled by the control signal, and capacitances C1 to Cn are selectively added in parallel with a variable capacitance Cv.

Figure 13:
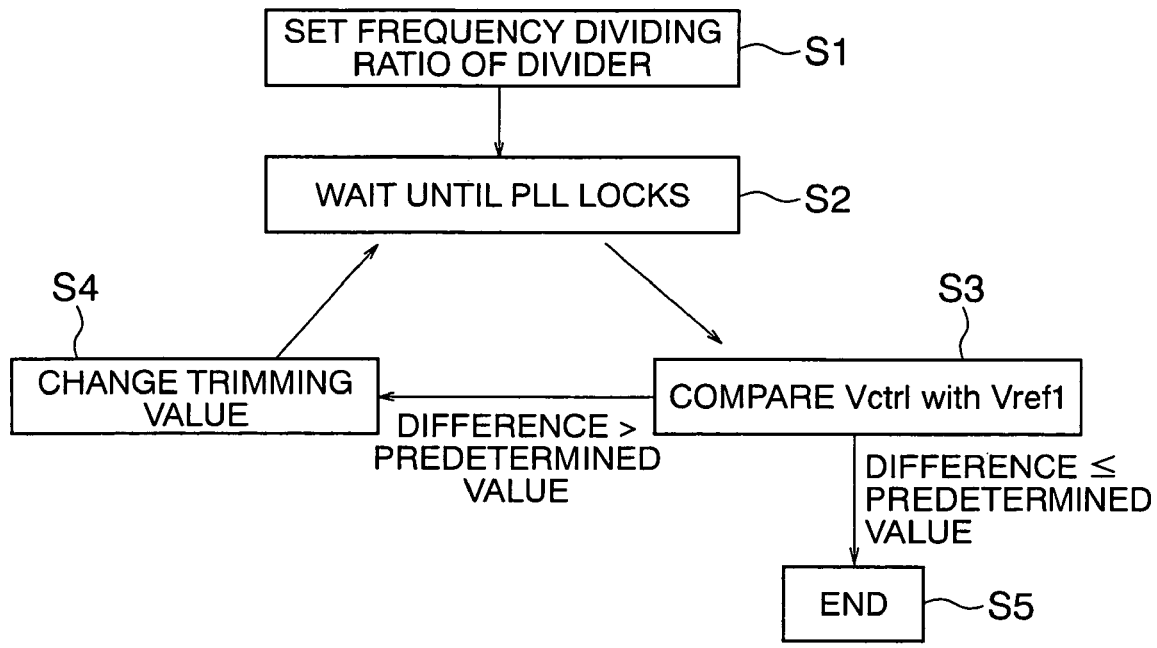
FIG. 13 is a flowchart showing the sequence of frequency adjustment in the same frequency synthesizer.

The F-V characteristics of this embodiment can be obtained following a sequence shown in FIG. 13.

First, the frequency dividing ratio of a divider is set (step S1). The process waits until a PLL 21 locks (step S2). In the locked state, the control voltage Vctrl and reference voltage Vref1 are compared (step S3). If a difference |Vctrl−Vref1| between the two voltages is larger than a predetermined value, a control signal supplied from the controller CT41 to the VCO 21 is changed (step S4). In this manner, the value of the variable capacitance Cv and/or the number of the capacitances C1 to Cn to be added to the variable capacitance Cv is adjusted.

The flow then returns to step S2. After the PLL 21 locks, the control voltage Vctrl and reference voltage Vref1 are compared in step S3. If the difference |Vctrl−Vref1| between the two voltages is equal to or smaller than the predetermined value, the flow advances to step S5 to terminate the adjusting operation.

Feedback control is performed following this sequence, and a trimming value is adjusted. As a consequence, it is possible to realize F-V characteristics by which the PLL 21 locks at a desired reference frequency Fref while the control voltage Vctrl is substantially equal to the reference voltage Vref1.

Figure 14:
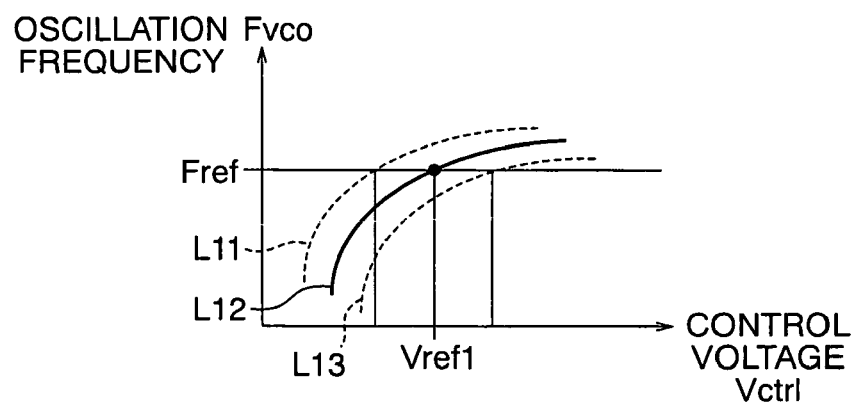
FIG. 14 is a graph showing changes in F-V characteristics resulting from frequency adjustment in the same frequency synthesizer.

When feedback control as described above is performed, as shown in FIG. 14, an F-V curve L11 or L13 at the beginning of the control converges toward an F-V curve L12. This makes it possible to obtain desired F-V characteristics by which the control voltage Vctrl is substantially equal to the reference voltage Vref1 while the PLL 21 locks at the reference frequency Fref.

Figure 15:
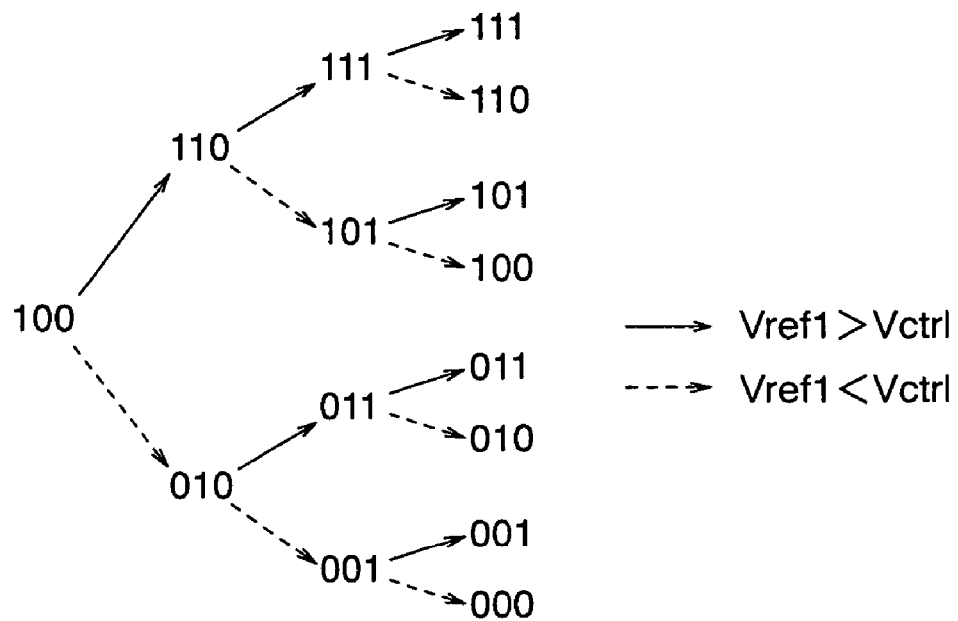
FIG. 15 is a view for explaining the sequence of frequency adjustment in the same frequency synthesizer.

The sequence of a process which selectively adds the capacitances C1 to Cn to the variable capacitance Cv will be described below with reference to FIG. 15.

Assume that three types of capacitances C1 to C3 are present and selectively added to the variable capacitance Cv as follows by a 3-bit control signal.

1) When the control signal is "000": none of the capacitances C1 to C3 is added.

2) When the control signal is "001": only the capacitance C1 is added, and the capacitances C2 and C3 are not added.

3) When the control signal is "010: only the capacitance C2 is added, and the capacitances C1 and C3 are not added.

4) When the control signal is "011": the capacitances C1 and C2 are added, and the capacitance C3 is not added.

5) When the control signal is "100": only the capacitance C3 is added, and the capacitances C1 and C2 are not added.

6) When the control signal is "101": the capacitances C1 and C3 are added, and the capacitance C2 is not added.

7) When the control signal is "110": the capacitances C2 and C3 are added, and the capacitance C1 is not added.

8) When the control signal is "111": all the capacitances C1 to C3 are added.

Of 1) to 8) described above, 5) the case in which the control signal is "100", i.e., "only the capacitance C3 is added, and the capacitances C1 and C2 are not added" in substantially the center is first selected.

If the PLL 21 does not lock at the reference frequency Fref in this stage, whether reference voltage Vref1>control voltage Vctrl or reference voltage Vref1<control voltage Vctrl is checked.

If reference voltage Vref1>control voltage Vctrl, as indicated by a solid-line arrow, 6) the case in which the control signal is "110", i.e., "the capacitances C2 and C3 are added, and the capacitance C1 is not added" substantially intermediate between 5) and 8) is selected.

If reference voltage Vref1<control voltage Vctrl, as indicated by a dotted-line arrow, 3) the case in which the control signal is "010", i.e., "only the capacitance C2 is added, and the capacitances C1 and C3 are not added" substantially intermediate between 1) and 5) is selected.

As described above, when the addition of the three types of capacitances C1 to C3 is to be controlled by using the 3-bit control signal following the successive comparison method, a comparison loop must be formed three times.

Likewise, when the addition of four types of capacitances C1 to C4 is to be controlled by using a 4-bit control signal following the successive comparison method, a comparison loop must be formed four times.

When the addition of n types of capacitances C1 to Cn is to be controlled by using an n-bit control signal following the successive comparison method, a comparison loop must be formed n times.

Figure 16:
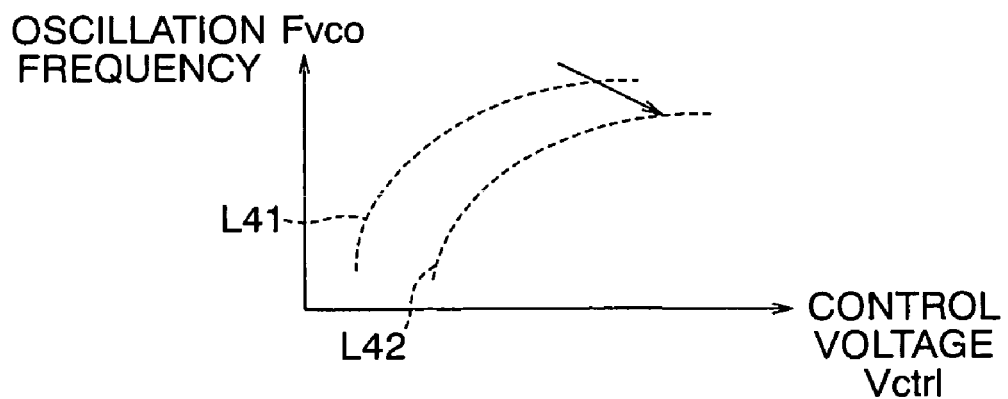
FIG. 16 is a graph showing the relationship between added capacitances and F-V curves in the same frequency synthesizer.

As indicated by the arrow shown in FIG. 16, as a capacitance C to be added to the variable capacitance Cv increases, the F-V curve changes from L41 to L42.

In this embodiment, the frequency dividing ratio of the divider is given, and the control voltage Vctrl when the PLL locks is measured. The trimming value of the VCO 21 is controlled so that the control voltage Vctrl is equal to the desired reference voltage Vref1. In this manner, the VCO 21 can be oscillated at a desired frequency by applying the desired reference voltage.

(3) THIRD EMBODIMENT

Figure 17:
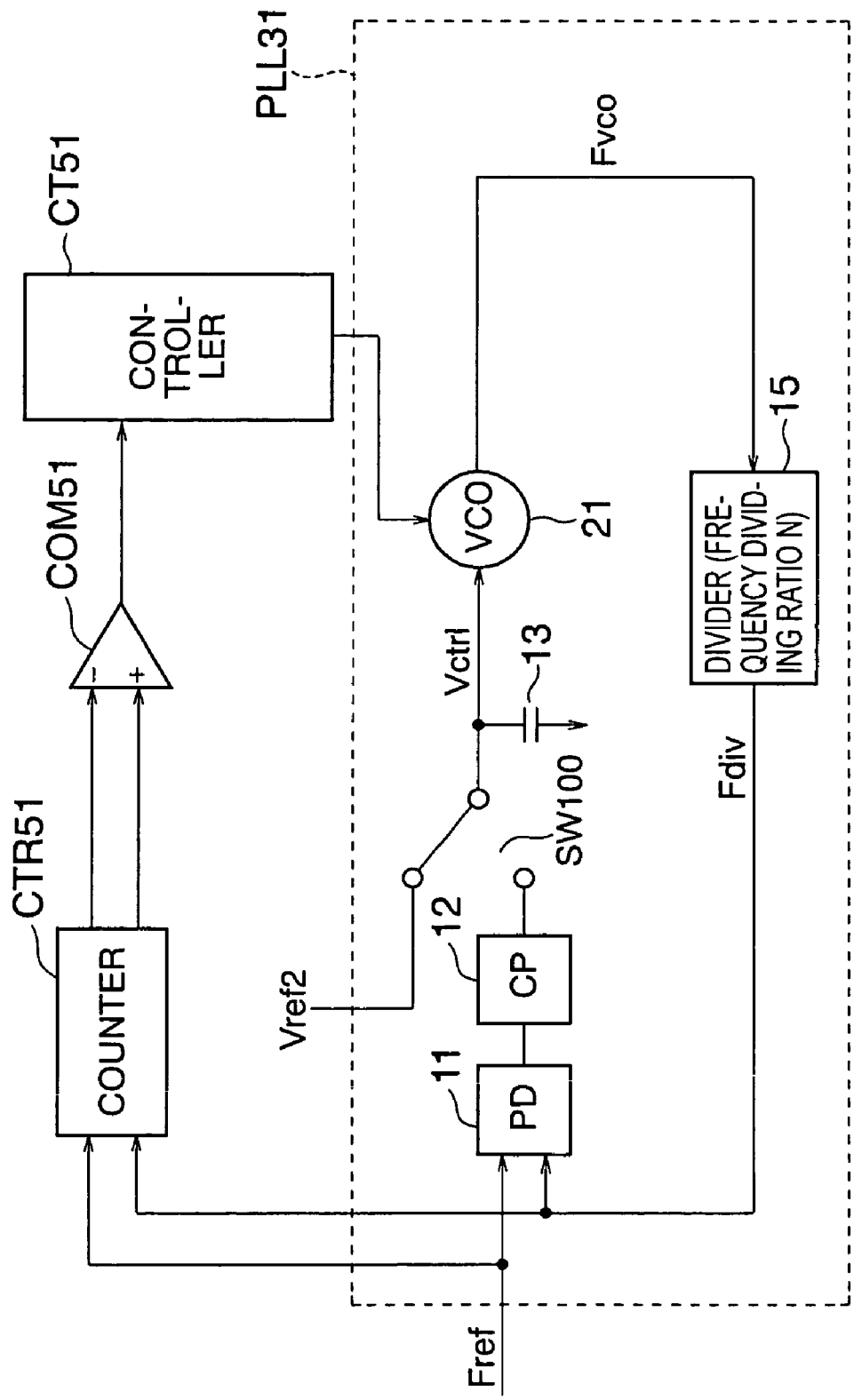
FIG. 17 is a circuit diagram showing the arrangement of a frequency synthesizer according to the third embodiment of the present invention.

A frequency synthesizer according to the third embodiment of the present invention will be described below with reference to FIG. 17 showing the arrangement of this frequency synthesizer.

This embodiment includes a PD 11, a CP 12, a loop filter 13, a VCO 21, a divider 15, a PLL 31 having a voltage switch SW100 which connects the output terminal of the CP 12 or a reference voltage Vref2 to the input terminal of the loop filter 13, a counter CTR51, a comparator COM51, and a controller CT51.

Before the voltage switch SW100 connects the output terminal of the CP (Charge Pump) 12 to the input terminal of the loop filter 13 and the PLL 31 starts a normal operation, the output terminal of the CP 12 and the input terminal of the loop filter 13 are separated to form an open loop. The reference voltage Vref2 is input to the input terminal of the loop filter 13, and a control voltage Vctrl is applied to the VCO 21 via the loop filter 13. Reference symbol Fvco denotes an oscillation frequency output from the VCO 21.

Although the oscillation frequency Fvco is desirably directly countable, counting is normally impossible in many cases because the frequency is too high. Therefore, a frequency divided by the divider 15 is measured by the counter CTR51.

Letting N (N>1) be the frequency dividing ratio of the divider 15 and Fdiv be the output frequency from the divider 15, we have $$Fvco = N \times Fdiv \qquad (6)$$

To count Fdiv, a reference frequency Fref is input to the counter CTR51. The counter CTR51 starts counting the reference frequency Fref and the frequency Fdiv divided by the divider 15 at the same time from time t=0, and stops counting when the count of the reference frequency Fref has reached a predetermined value Cref.

Letting Cdiv be the count of the frequency Fdiv, we have $$Fdiv \cong Fref \times Cdiv/Cref \qquad (7)$$

≅ is used because, although the count Cdiv is an integer, the phases of the frequencies Fref and Fdiv are not always equal at the start and end of counting.

F-V characteristics can be obtained by calculating the frequency Fvco by using expressions (6) and (7), thereby obtaining the control voltage Vctrl.

To obtain F-V characteristics by which the oscillation frequency Fvco is substantially equal to N times the reference frequency Fref at a certain control voltage Vctrl, the frequency dividing ratio N of the divider 15 is set such that $$N = Fvco/Fref \qquad (8)$$

Figure 18:
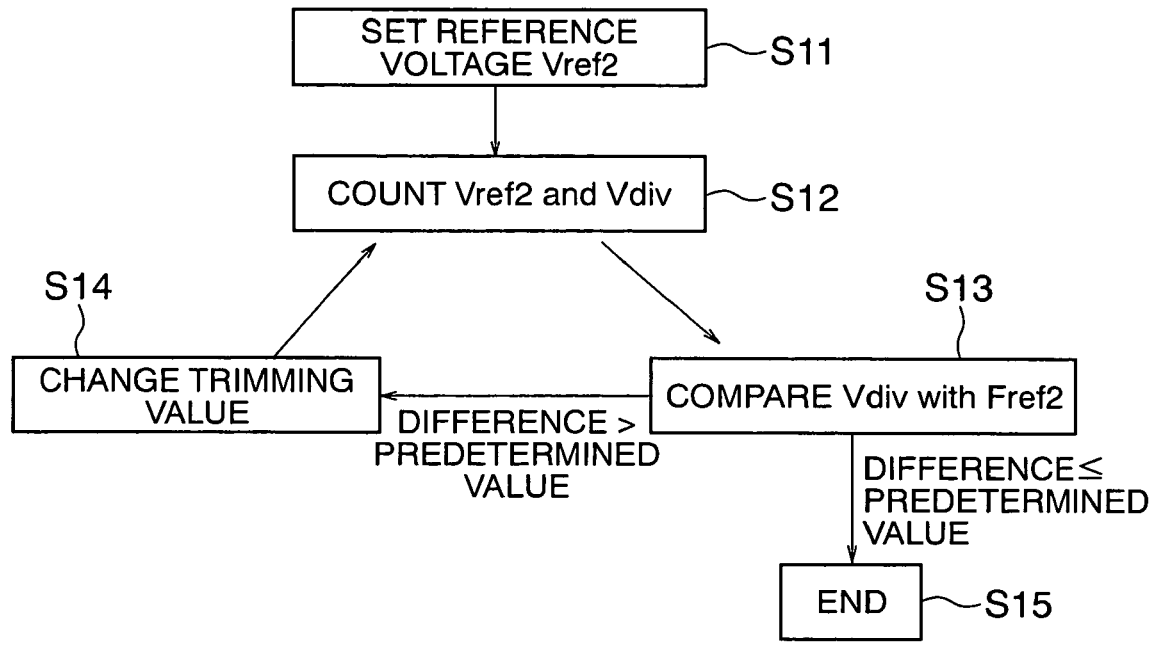
FIG. 18 is a flowchart showing the sequence of frequency adjustment in the same frequency synthesizer.

Then, the trimming value is set following a sequence shown in FIG. 18 as follows.

The reference voltage Vref2 is set (step S11). The frequency Fdiv is counted while the reference frequency Fref is counted K (K is an integer of 1 or more) times (step S12). The frequency Fdiv is compared with the reference frequency Fref (step 513).

If the difference between the count of the frequency Fdiv and the count of the reference frequency Fref has exceeded a predetermined value, the trimming value is changed (step S14), and the flow returns to step S12. If the difference between the count of the frequency Fdiv and the count of the reference frequency Fref is equal to or smaller than the predetermined value, the flow advances to step S15 to terminate the process.

Figure 19:
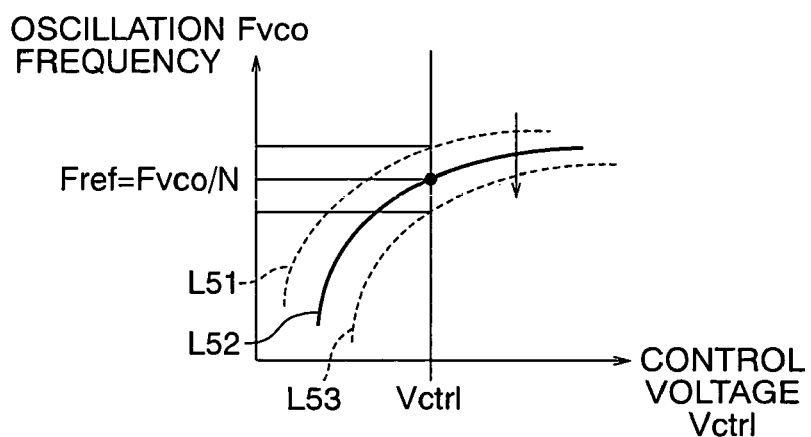
FIG. 19 is a graph showing changes in F-V characteristics resulting from frequency adjustment in the same frequency synthesizer.

As shown in FIG. 19, as capacitances C1 to Cn to be added to a variable capacitance Cv increase, a curve between the frequency F and control voltage Vctrl changes from L51 to L52, and from L52 to L53. Accordingly, the oscillation frequency Fvco at a certain set reference voltage Vref2 changes, so the PLL can be locked when the frequency Fdiv obtained by dividing the oscillation frequency Fvco by the frequency dividing ratio N becomes substantially equal to the reference frequency Fref.

In this embodiment, the reference voltage Vref2 is externally given, and the frequency Fdiv obtained by dividing the oscillation frequency Fvco from the VCO 21 by the divider 15 is measured. More specifically, the frequency Fdiv is counted for a time during which the reference frequency Fref is counted a predetermined number of times by using the counter CTR51. The comparator COM51 compares those counts of the reference frequency Fref and frequency Fdiv, which are obtained during the same time period, and the trimming value is set such that the difference between the two counts is equal to or smaller than a predetermined value. In this way, the trimming value can be set so that oscillation can be performed at a desired frequency while the control voltage Vctrl is substantially matched with the desired reference voltage Vref2.

As described earlier, the phases of the frequencies Fref and Fdiv are not always equal at the start and end of counting. More specifically, when the frequency Fdiv output from the divider 15 is counted on the basis of the reference frequency Fref, this counting of the frequency Fdiv from the divider 15 is terminated when the reference frequency Fref is counted Cref times. Since, however, the phase of the output from the divider 15 and that of the signal having the reference frequency Fref are not synchronized, the count of the output frequency Fdiv from the divider 15 changes in accordance with the phase relationship. This produces an error in the count of the frequency Fdiv by the counter CTR51.

Figure 20:
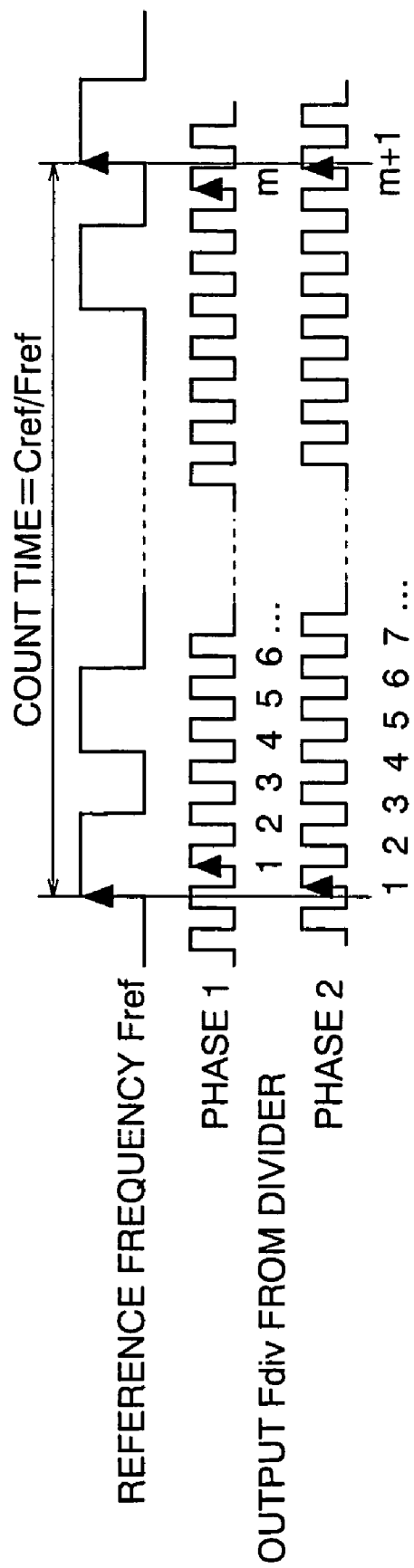
FIG. 20 is a timing chart showing a measurement error present in a counter of the same frequency synthesizer.

FIG. 20 shows a count difference produced by the phase of the output frequency Fref from the divider 15.

Assume different phases 1 and 2 having the same frequency Fdiv in a counting time (=Cref/Fref) during which counting is started from the leading edge of the reference frequency Fref and performed Cref times. Since the leading edge of the first waveform of phase 1 lags behind that of phase 2, a count m (m is an integer of 1 or more) of phase 1 is smaller than a count m+1 of phase 2.

In other words, even different frequencies may have the same count depending on their phases.

Figure 21:
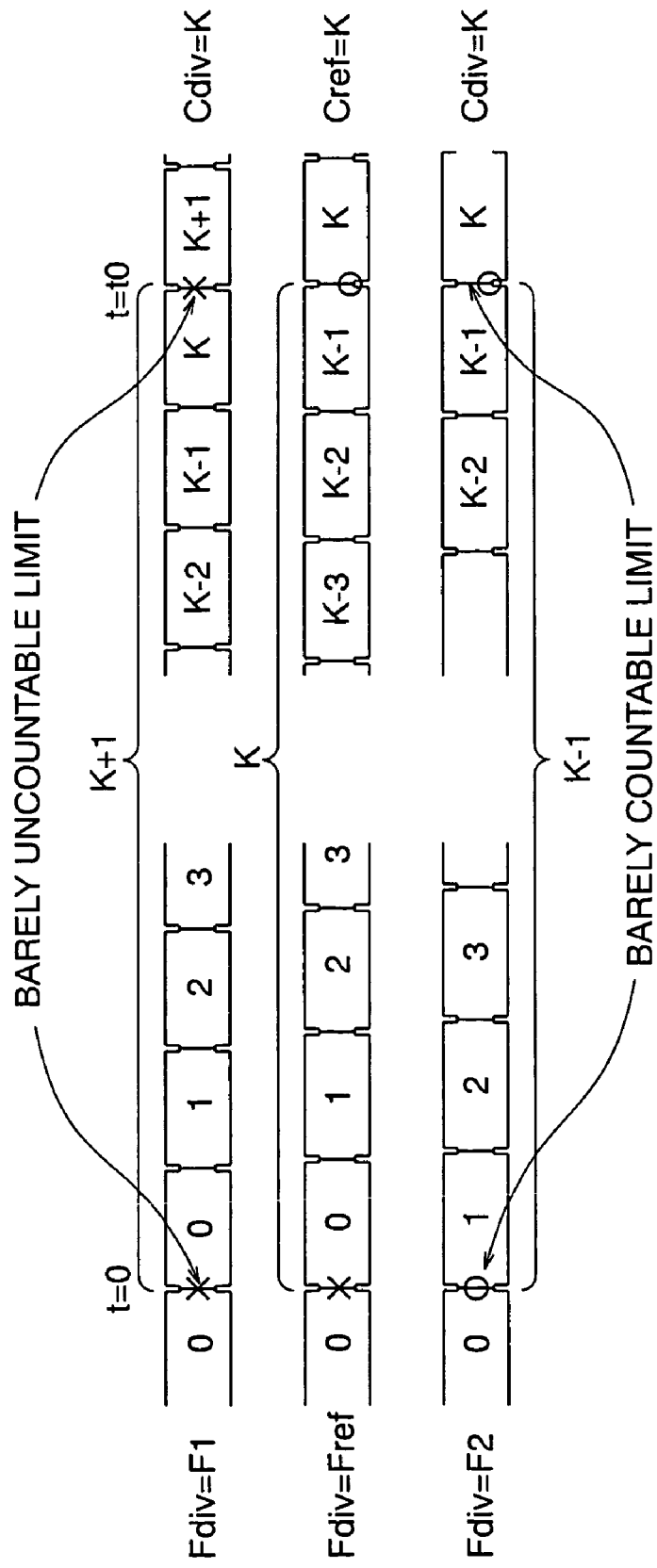
FIG. 21 is a view for explaining the measurement error present in the counter of the same frequency synthesizer.

A frequency range within which different frequencies may have the same count will be explained below with reference to FIG. 21.

(a) The output frequency Fdiv from the divider 15 is F1 (F1>Fref), and the leading edge of the waveform is not counted at the start and end of counting.

(b) The output frequency Fdiv is equal to the reference frequency Fref, and the leading edge of the waveform is not counted at the start of counting but counted at the end of counting.

(c) The output frequency Fdiv is F2 (F2<Fref), and the leading edge of the waveform is counted at the start and end of counting.

In each of (a) to (c), the count Cdiv is K (K is an integer of 1 or more).

As described above, the same count may be obtained if the frequency Fdiv has the following relationship $$(K-1)/T < Fdiv < (K+1)/T \qquad (9)$$

where T is the count time, and T=Cref/Fref.

From expression (9), the maximum width of the error is 2/T.

The same count may be obtained over the frequency range 2/T. When frequency adjustment is to be performed by using the counter CTR51 which may produce this measurement error, the following relationship desirably holds between the frequency adjusting step and the frequency range having the error width 2/T $$\text{Frequency adjusting step} > 2/T \qquad (10)$$

That is, a necessary count time T can be determined by setting a frequency step to be adjusted.

Figure 22:
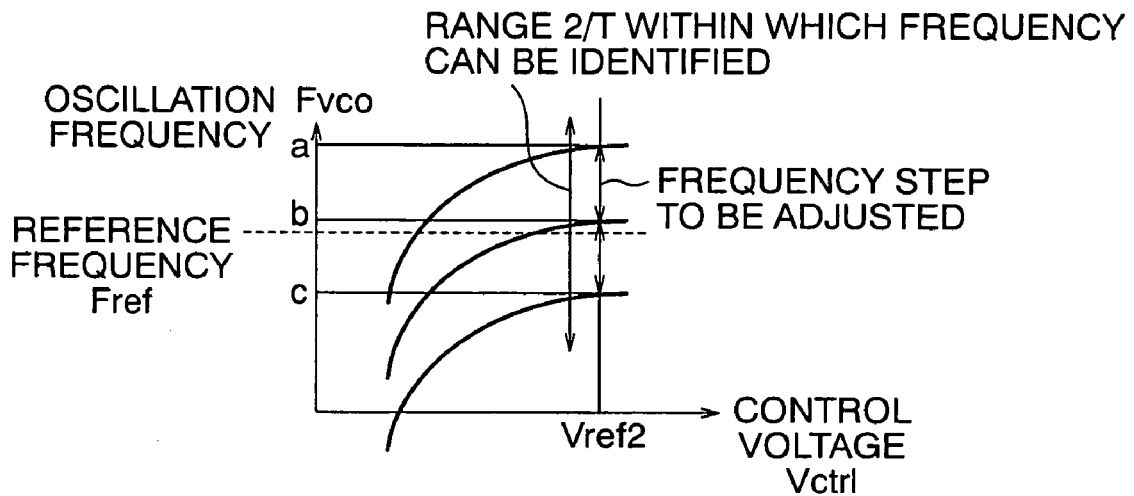
FIG. 22 is a graph showing an example of the measurement error range of the counter and an example of a frequency step to be adjusted in the same frequency synthesizer.

As shown in FIG. 22, if a range within which a frequency F to be measured can be identified, i.e., the maximum error range 2/T is larger than the frequency adjusting step, this frequency may be adjusted to a frequency a or a frequency c shown in FIG. 22 even when it is adjusted to be equal to the reference frequency Fref.

Figure 23:
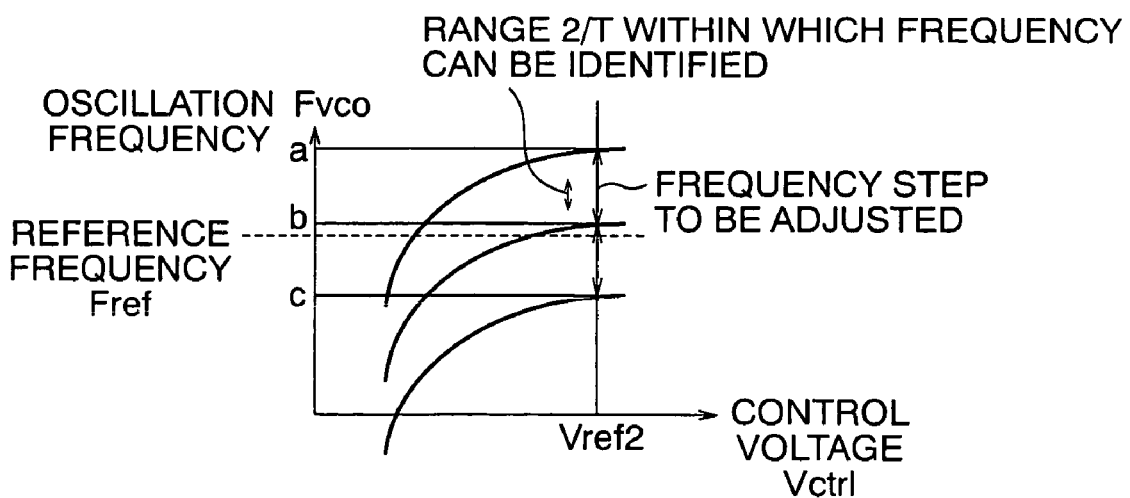
FIG. 23 is a graph showing another example of the measurement error range of the counter and another example of the frequency step to be adjusted in the same frequency synthesizer.

On the other hand, as shown in FIG. 23, if the maximum error range 2/T is smaller than the frequency adjusting step, the frequency may be adjusted to a frequency b which is the closest, of the frequencies a, b, and c, to the reference frequency Fref.

As described above, the maximum error range 2/T is desirably smaller than the adjustable frequency step because higher accuracy is obtained.

For example, assuming that the frequency dividing ratio N of the divider 15 is 200, the reference frequency Fref is 20 Mz, and the frequency step to be adjusted is 10 MHz, the divided frequency Fdiv must be adjusted by a step of 10 MHz/200=50 KHz. Accordingly, T>40 μsec is desirable since 50 KHz>2/T.

(4) FOURTH EMBODIMENT

A frequency synthesizer according to the fourth embodiment of the present invention will be described below.

Figure 24:
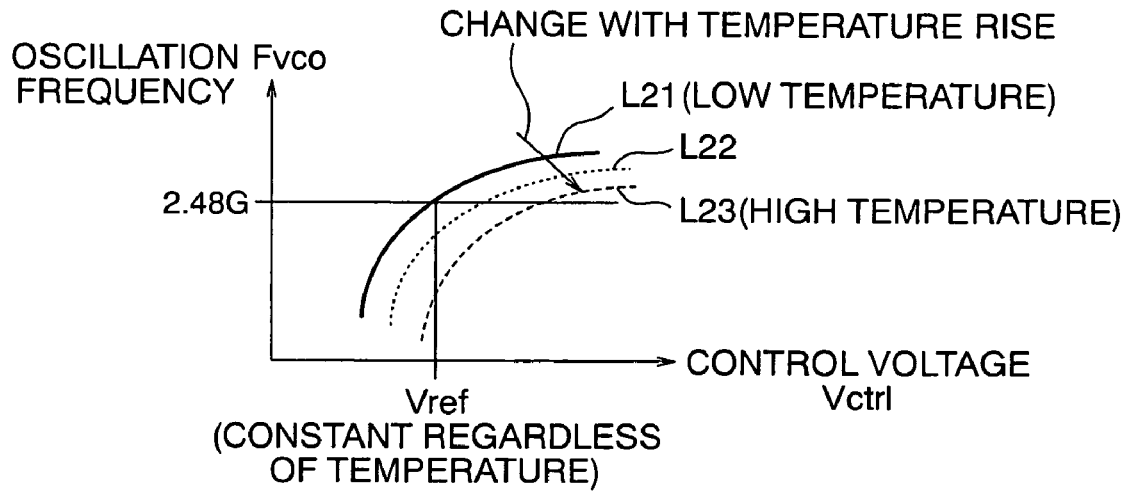
FIG. 24 is a graph showing changes in F-V characteristics with temperature when a control voltage is held constant independently of the temperature.

When a VCO is formed by using, e.g., a CMOS circuit, the oscillation frequency fluctuates in accordance with the temperature. For example, as shown in FIG. 24, an F-V curve changes from L21 to L22, and from L22 to L23, in accordance with the temperature rise.

When a reference voltage Vref is held constant regardless of temperature changes, a PLL can be locked at a desired frequency of 2.48 GHz on the F-V curve L21 at a low temperature. However, if the temperature rises and the F-V curve changes to L22 or L23, a PLL cannot be locked any longer at a frequency of 2.48 GHz.

As described above, if the reference voltage Vref is fixed at a predetermined value independently of the temperature, a PLL 21 cannot be locked at a desired frequency when the temperature changes.

Figure 25:
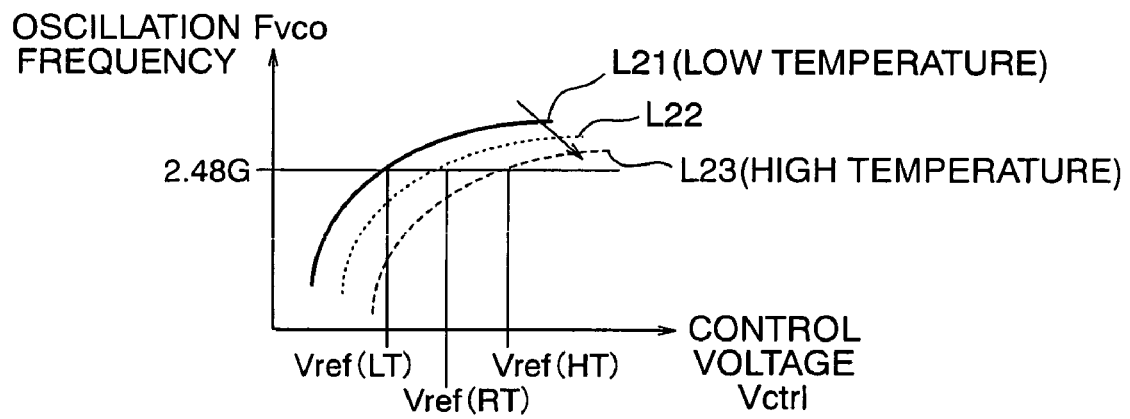
FIG. 25 is a graph showing F-V characteristics when a reference voltage is changed in accordance with the temperature in the frequency synthesizer of the second embodiment.

By contrast, in this embodiment as shown in FIG. 25, if the F-V curve changes from L21 to L22, and from L22 to L23, in accordance with the temperature rise, the reference voltage Vref is changed from Vref(LT) to Vref(RT), and from Vref(RT) to Vref(HT), in accordance with this change. In this manner, the PLL 21 can be locked at a desired frequency of 2.48 GHz regardless of the temperature.

Figure 26:
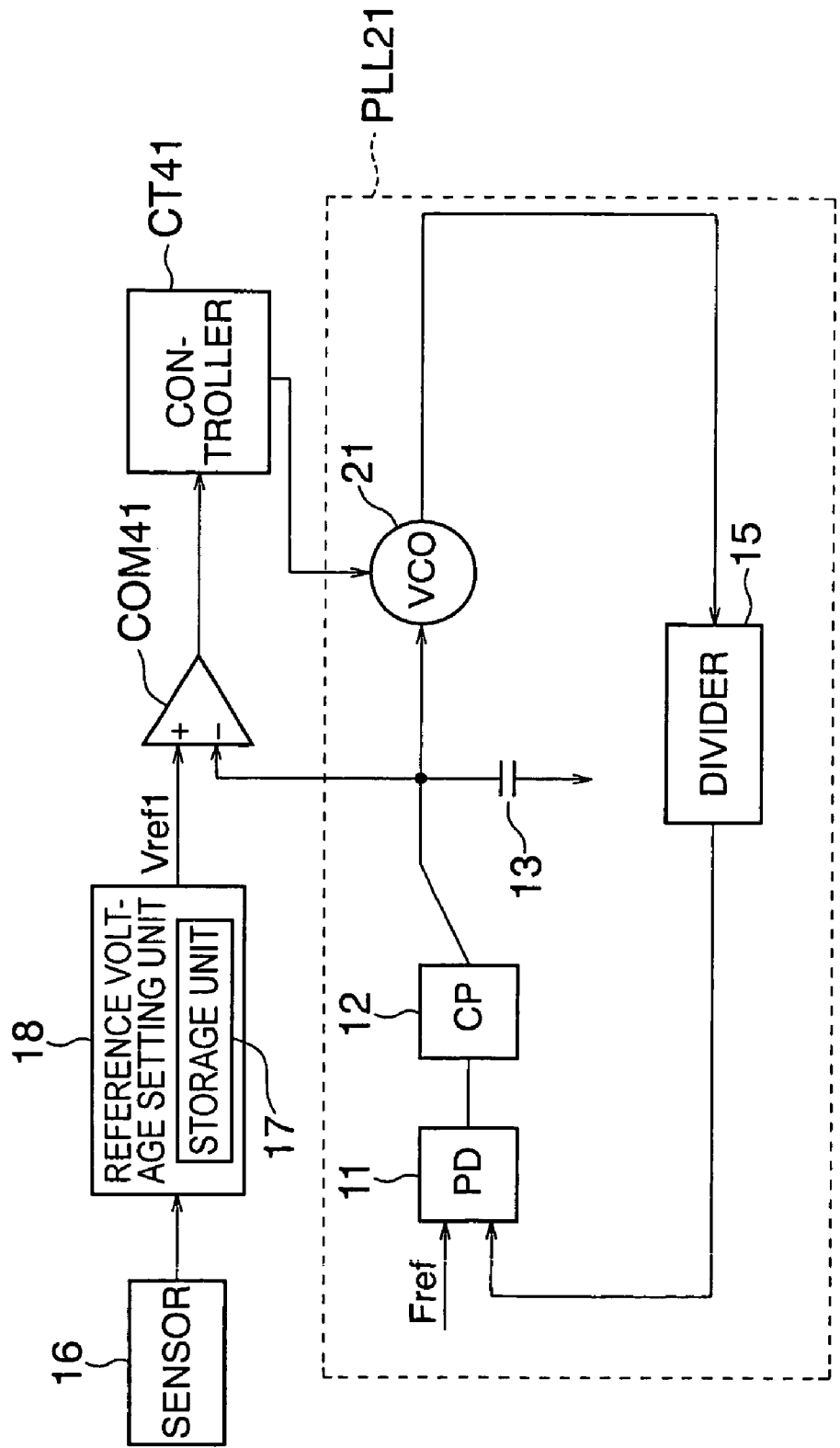
FIG. 26 is a circuit diagram showing, as the fourth embodiment of the present invention, an example of a modification of the arrangement of the frequency synthesizer according to the second embodiment.

A practical arrangement is a modification of the second embodiment described earlier. For example, as shown in FIG. 26, information indicating a table of F-V curves corresponding to temperatures is prestored in a storage unit 17. A sensor 16 measures the ambient temperature of a VCO 21, and a reference voltage setting unit 18 acquires information concerning an F-V curve corresponding to the temperature. On the basis of this information, a reference voltage Vref1 by which a PLL 21 can be locked at a desired reference frequency Fref is obtained and output to a comparator COM41. Feedback control is performed such that a control voltage Vctrl to be applied to the VCO 21 is equal to the reference voltage Vref1.

Figure 27:
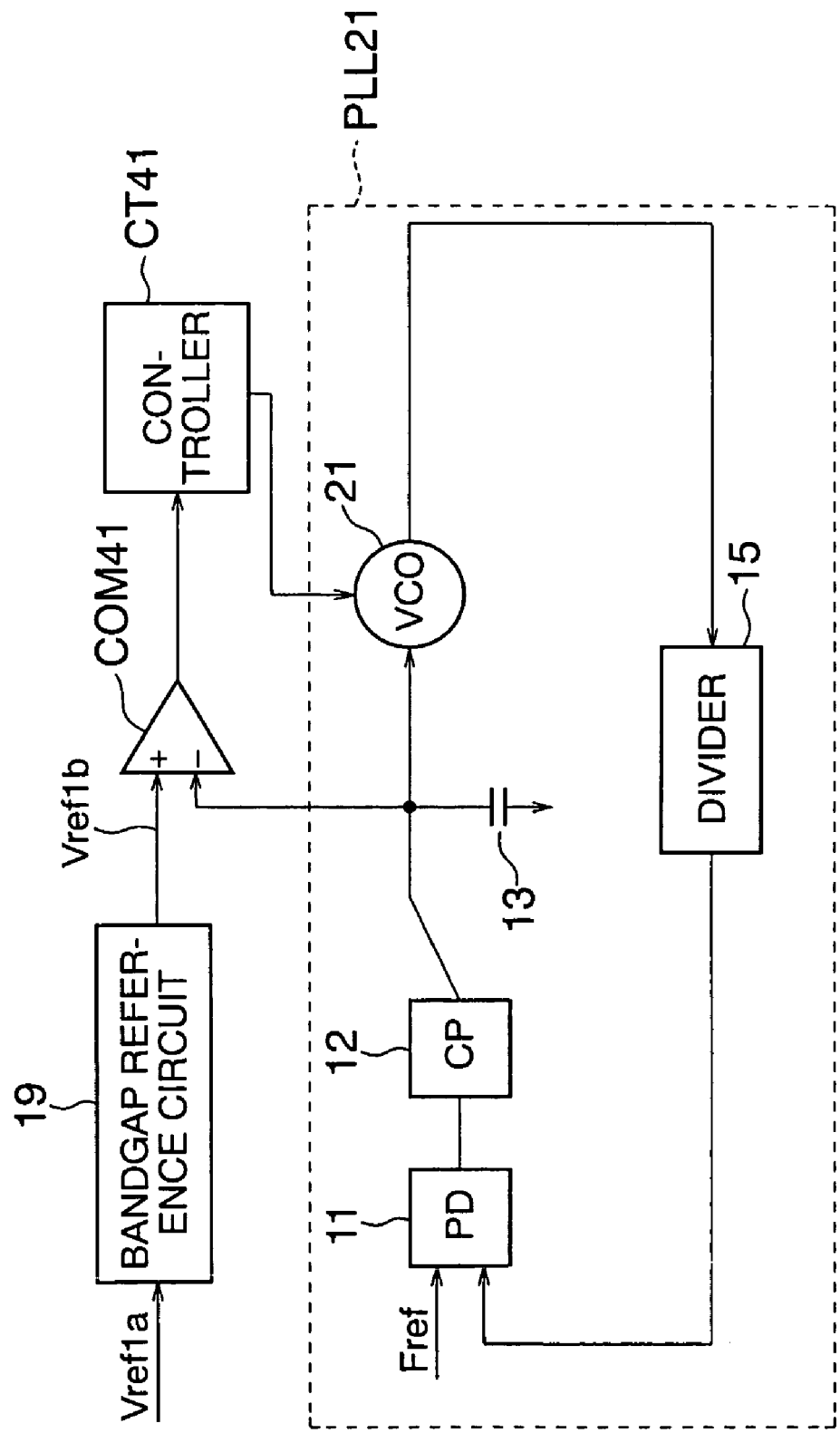
FIG. 27 is a circuit diagram showing, as the fourth embodiment of the present invention, another example of the modification of the arrangement of the frequency synthesizer according to the second embodiment.

Another modification of the second embodiment is also possible. For example, as shown in FIG. 27, instead of measuring the temperature by using a sensor, a reference voltage Vref1a is input to a bandgap reference circuit 19 which changes its current value or voltage value in accordance with the temperature. As a consequence, a reference voltage Vref1b which is changed in accordance with the temperature can be obtained from the reference voltage Vref1a.

Figure 28:
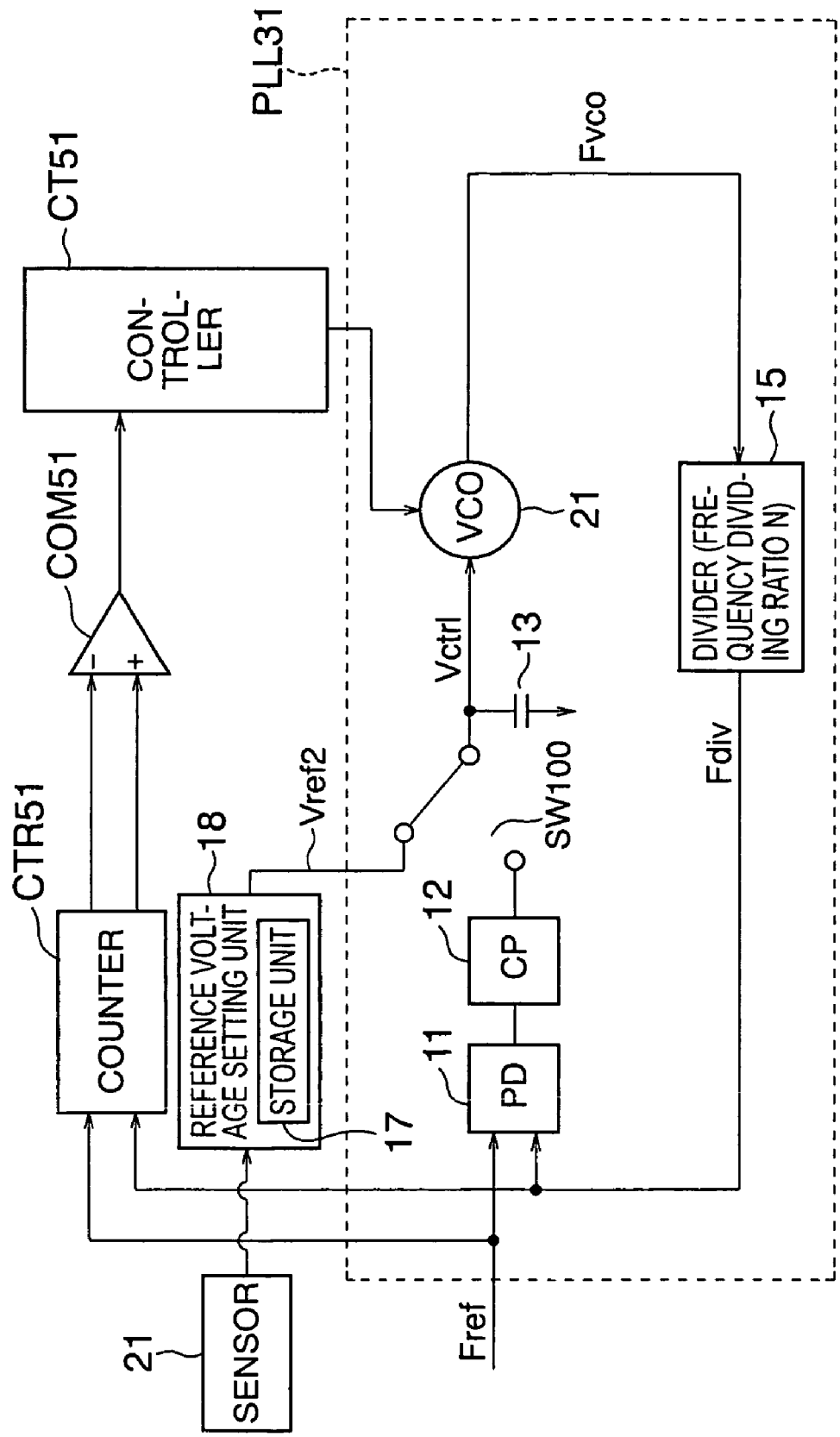
FIG. 28 is a circuit diagram showing, as the fourth embodiment of the present invention, an example of a modification of the arrangement of the frequency synthesizer according to the third embodiment.

The arrangement may also be a modification of the third embodiment described above. For example, as shown in FIG. 28, information indicating a table of F-V curves corresponding to temperatures is prestored in a storage unit 17. A sensor 16 measures the ambient temperature of a VCO 21, and a reference voltage setting unit 18 acquires information concerning an F-V curve corresponding to the temperature. On the basis of this information, a reference voltage Vref2 by which a PLL 31 can be locked at a desired reference frequency Fref is obtained, and output to the VCO 21 via a voltage switch SW100 and loop filter 13.

Figure 29:
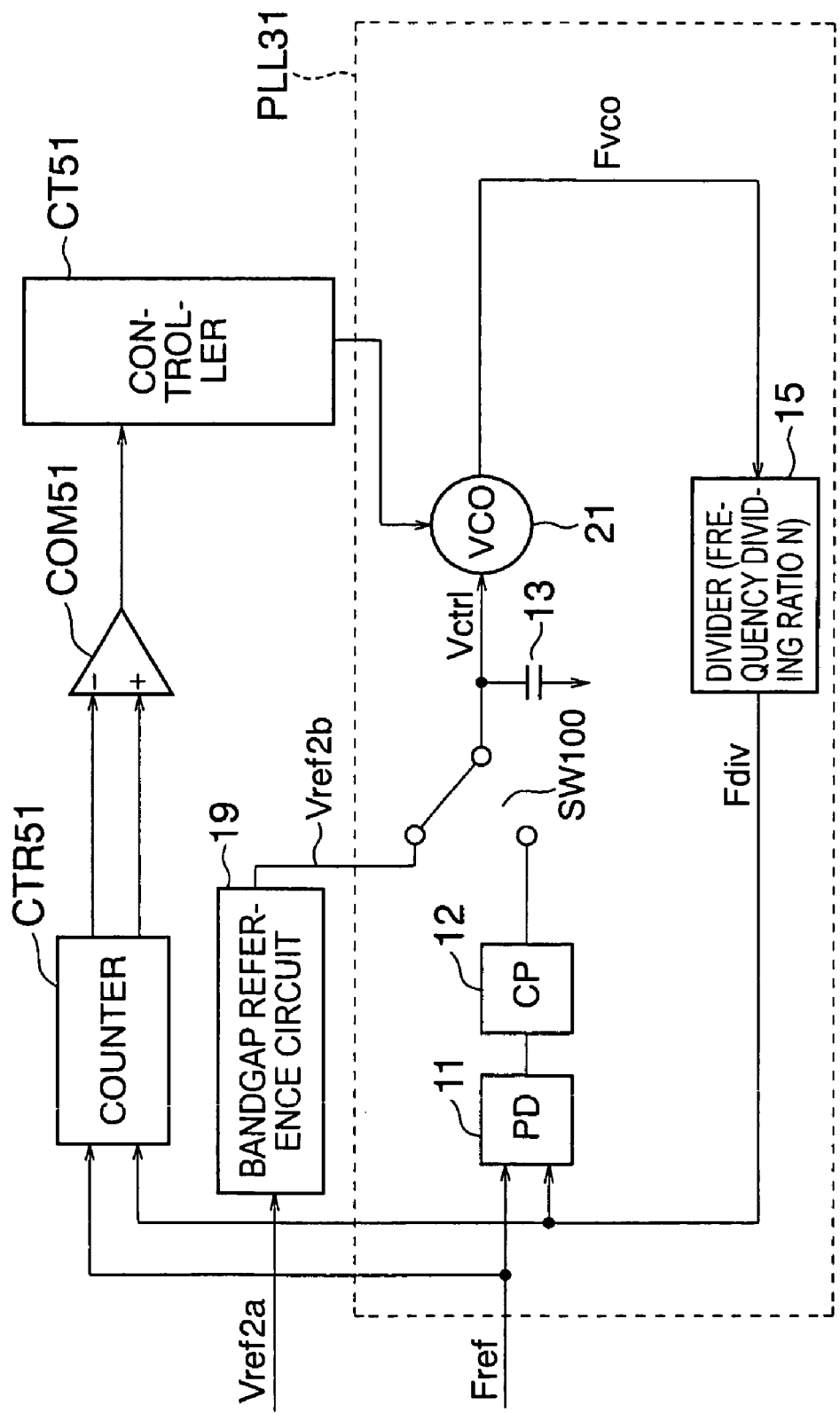
FIG. 29 is a circuit diagram showing, as the fourth embodiment of the present invention, another example of the modification of the arrangement of the frequency synthesizer according to the third embodiment.

Another modification of the third embodiment is also possible. For example, as shown in FIG. 29, instead of measuring the temperature by using a sensor, a reference voltage Vref2a is input to a bandgap reference circuit 19 which changes its current value or voltage value in accordance with the temperature. As a consequence, a reference voltage Vref2b which is changed in accordance with the temperature can be obtained from the reference voltage Vref2a.

(5) FIFTH EMBODIMENT

A frequency synthesizer according to the fifth embodiment of the present invention will be described below.

This embodiment relates to counting of the output frequency Fdiv from the divider 15 in the third embodiment shown in FIG. 17, or in the fourth embodiment shown in FIG. 28 or 29.

Figure 30:
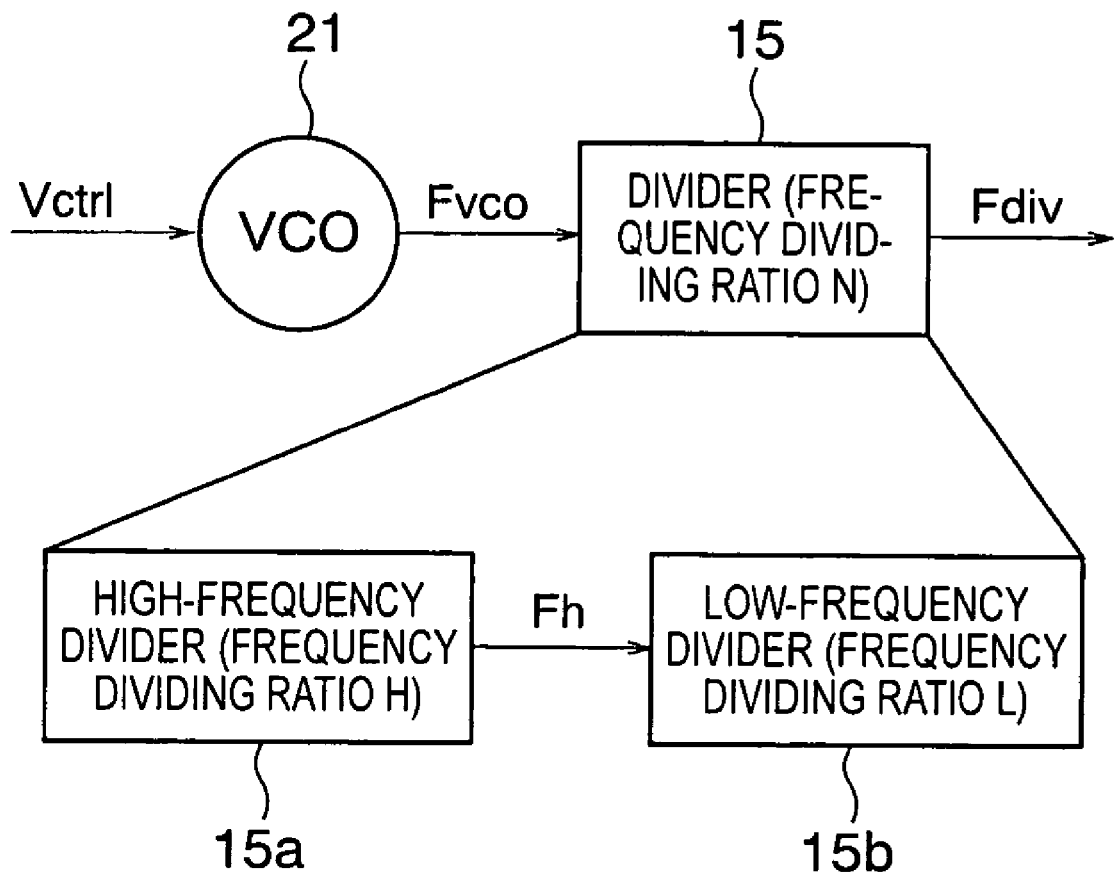
FIG. 30 is a block diagram showing an example of the arrangement of a divider included in a frequency synthesizer according to the fifth embodiment of the present invention.

As shown in FIG. 30, a control voltage Vctrl is input to a VCO 21, an oscillation frequency Fvco is output and divided by a divider 15 having a frequency dividing ratio N, and a frequency Fdiv is output.

The divider 15 is sometimes made up of a high-frequency divider 15a and low-frequency divider 15b. Letting N be the frequency dividing ratio of the divider 15 as a whole, H be the frequency dividing ratio of the high-frequency divider 15a, and L be the frequency dividing ratio of the low-frequency divider 15b, we have $$N = H \times L \quad (11)$$

The oscillation frequency Fvco is input to the high-frequency divider 15a and divided by the frequency dividing ratio H, and a signal having a frequency Fh is output.

This signal is input to the low-frequency divider 15b and divided by the frequency dividing ratio L, and a signal having the final frequency Fdiv is output.

In this case, a counter CRT51 does not count the lowest frequency Fdiv output from the low-frequency divider 15b, but counts the higher frequency Fh output from the high-frequency divider 15a. This makes it possible to increase the measurement accuracy or shorten the measurement time.

When compared to the case in which the final output Fdiv from the low-frequency divider 15b is counted, a value counted by the counter CRT51 increases L times.

Also, the frequency range within which the counter CTR51 measures the same count for different frequencies is 2/T (count time) as explained by using expression (9), and this error value remains unchanged.

Since, however, the frequency dividing ratios are different, the operation time necessary for adjustment can be shortened by measuring the output from the high-frequency divider 15a as explained below.

Assume, for example, that the frequency dividing ratio N of the divider 15 as a whole is 200, the frequency dividing ratio H of the high-frequency divider 15a is 8, the frequency dividing ratio L of the low-frequency divider 15b is 25, the reference frequency Fref is 20 MHz, and the frequency step to be adjusted is 10 MHz.

In this case, the frequency Fh divided by the high-frequency divider 15a can be adjusted by a step of 1.25 MHz because 10 MHz/8=1.25 MHz.

From expression (9), therefore, 1.25 MHz>2/T, so T>1.6 µsec.

By contrast, when the output frequency Fdiv from the low-frequency divider 15b is to be finally measured, as described in the third embodiment, adjustment must be performed by a step of 50 kHz because 10 MHz/200=50 kHz.

Since 50 kHz>2/T, T>40 µsec is required.

Accordingly, the output from the high-frequency divider 15a can be measured 25 times faster than the output from the low-frequency divider 15b.

The frequency synthesizer according to the above embodiment can control the control voltage of the VCO such that the VCO can oscillate at a desired frequency even when the F-V characteristics of the VCO fluctuate by the temperature or the like.

Each of the above embodiments is merely an example and does not limit the present invention. For example, the arrangements of the LC oscillators shown in FIGS. 6 to 8 are examples and can be variously modified within the technical scope of the present invention.

What is claimed is:

1. A frequency synthesizer comprising:
a phase locked loop circuit which receives a reference signal having a reference frequency and a first signal having a first frequency, compares phases of the reference signal and the first signal, applies a control voltage based on a phase comparison result to an input terminal of a voltage controlled oscillator to generate a second signal having an oscillation frequency, outputs the second signal from an output terminal, and supplies the second signal to a divider to divide the oscillation frequency of the second signal and output the first signal;
a controller which generates and supplies a control signal to the voltage controlled oscillator;
a voltage comparator which receives a reference voltage, compares the reference voltage with the control voltage applied to the voltage controlled oscillation circuit, and supplies a voltage comparison result to the controller,
wherein on the basis of the voltage comparison result, the controller generates the control signal such that the control voltage and reference voltage are equal, and supplies the control signal to the voltage controlled oscillator; and
wherein the voltage controlled oscillator has an arrangement in which a coil and variable capacitance are connected in parallel between the input terminal and output terminal,
one of a plurality of capacitances is selectively connected between the input terminal and output terminal by a switch in parallel with the variable capacitance,
between the input terminal and output terminal, the coil having two ends connected in series, the variable capacitance having two ends connected in series, and, as the plurality of capacitances and the switch:
a first capacitance unit in which a first capacitance and first switch are connected in series,
a second capacitance unit in which a second capacitance and second switch are connected in series, and . . .
an nth (n is an integer of not less than 2) capacitance unit in which an nth capacitance and nth switch are connected in series,
wherein the first capacitance unit, the second capacitance unit, . . . and the nth capacitance unit are connected in parallel with each other,
ON/OFF of each of the first, second, . . . , nth switches is controlled by the control signal, and
each of the first, second, . . . , nth capacitances is formed by a gate capacitance present between a gate terminal of a MIS transistor and a terminal to which a source and drain of the MIS transistor are shortcircuited.

2. A frequency synthesizer comprising:
a phase locked loop circuit which receives a reference signal having a reference frequency and a first signal having a first frequency, compares phases of the reference signal and the first signal, applies a control voltage based on a phase comparison result to an input terminal of a voltage controlled oscillator to generate a second signal having an oscillation frequency, outputs the second signal from an output terminal, and supplies the second signal to a divider to divide the oscillation frequency of the second signal and output the first signal;
a controller which generates and supplies a control signal to the voltage controlled oscillator;
further comprising a voltage comparator which receives a reference voltage, compares the reference voltage with the control voltage applied to the voltage controlled oscillation circuit, and supplies a voltage comparison result to the controller,
wherein on the basis of the voltage comparison result, the controller generates the control signal such that the control voltage and reference voltage are equal, and supplies the control signal to the voltage controlled oscillator; and
wherein the voltage controlled oscillator has an arrangement in which a coil and variable capacitance are connected in parallel between the input terminal and output terminal,
one of a plurality of capacitances is selectively connected between the input terminal and output terminal by a switch in parallel with the variable capacitance,
between the input terminal and output terminal, the coil having two ends connected in series, the variable capacitance having two ends connected in series, and, as the plurality of capacitances and the switch:
a first capacitance unit in which a first capacitance and first switch are connected in series,
a second capacitance unit in which a second capacitance and second switch are connected in series, and . . .
an nth (n is an integer of not less than 2) capacitance unit in which an nth capacitance and nth switch are connected in series,
wherein the first capacitance unit, the second capacitance unit, . . . and the nth capacitance unit are connected in parallel with each other, and
ON/OFF of each of the first, second, . . . , nth switches is controlled by the control signal.

3. A synthesizer according to claim 2, further comprising:
a sensor which measures an ambient temperature of the voltage controlled oscillator; and a reference voltage setting unit which has a storage unit storing information concerning the ambient temperature and a control voltage corresponding to the ambient temperature, reads out from the storage unit the control voltage corresponding to the ambient temperature measured by the sensor, and supplies the readout control voltage as the reference voltage to the voltage comparator.

4. A synthesizer according to claim 2, further comprising a bandgap reference circuit which receives an external voltage, changes the voltage into a value corresponding to an ambient temperature of the voltage controlled oscillator, and supplies the value as the reference voltage to the voltage comparator.

5. A frequency synthesizer comprising:
a phase locked loop circuit which receives a reference signal having a reference frequency and a first signal having a first frequency, compares phases of the reference signal and the first signal, applies a control voltage based on a phase comparison result to an input terminal of a voltage controlled oscillator to generate a second signal having an oscillation frequency, outputs the second signal from an output terminal, and supplies the second signal to a divider to divide the oscillation frequency of the second signal and output the first signal;
a controller which generates and supplies a control signal to the voltage controlled oscillator;
a voltage comparator which receives a reference voltage, compares the reference voltage with the control voltage applied to the voltage controlled oscillation circuit, and supplies a voltage comparison result to the controller,
wherein on the basis of the voltage comparison result, the controller generates the control signal such that the control voltage and reference voltage are equal, and supplies the control signal to the voltage controlled oscillator; and
wherein the voltage controlled oscillator has an arrangement in which a coil and variable capacitance are connected in parallel between the input terminal and output terminal,
one of a plurality of capacitances is selectively connected between the input terminal and output terminal by a switch in parallel with the variable capacitance,
ON/OFF of the switch is controlled by the control signal.

6. A synthesizer according to claim 5, further comprising:
a sensor which measures an ambient temperature of the voltage controlled oscillator; and
a reference voltage setting unit which has a storage unit storing information concerning the ambient temperature and a control voltage corresponding to the ambient temperature, reads out from the storage unit the control voltage corresponding to the ambient temperature measured by the sensor, and supplies the readout control voltage as the reference voltage to the voltage comparator.

7. A synthesizer according to claim 5, further comprising a bandgap reference circuit which receives an external voltage, changes the voltage into a value corresponding to an ambient temperature of the voltage controlled oscillator, and supplies the value as the reference voltage to the voltage comparator.

8. A frequency synthesizer comprising:
a phase locked loop circuit which receives a reference signal having a reference frequency and a first signal having a first frequency, compares phases of the reference signal and the first signal, applies a control voltage based on a phase comparison result to an input terminal of a voltage controlled oscillator to generate a second signal having an oscillation frequency, outputs the second signal from an output terminal, and supplies the second signal to a divider to divide the oscillation frequency of the second signal and output the first signal;
a controller which generates and supplies a control signal to the voltage controlled oscillator;
a voltage switch which applies, instead of the control voltage, an externally applied reference voltage to the voltage controlled oscillator;
a counter which receives the first signal which the divider outputs by dividing the frequency of the second signal output from the voltage controlled oscillator to which the reference voltage is applied, and the reference signal, measures the reference frequency and first frequency, and outputs measurement values;
a frequency comparator which, on the basis of the measurement values output from the counter, compares the reference frequency with the first frequency, and outputs a frequency comparison result to the controller,
wherein the controller generates and supplies the control signal to the voltage controlled oscillator, such that the first frequency of the first signal which the divider outputs by dividing the frequency of the second signal which the voltage controlled oscillator outputs when receiving the reference voltage is equal to the reference frequency; and
wherein the voltage controlled oscillator has an arrangement in which a coil and variable capacitance are connected in parallel between the input terminal and output terminal,
one of a plurality of capacitances is selectively connected between the input terminal and output terminal by a switch in parallel with the variable capacitance,
ON/OFF of the switch is controlled by the control signal.

9. A synthesizer according to claim 8, further comprising:
a sensor which measures an ambient temperature of the voltage controlled oscillator; and
a reference voltage setting unit which has a storage unit storing information concerning the ambient temperature and a control voltage corresponding to the ambient temperature, reads out from the storage unit the control voltage corresponding to the ambient temperature measured by the sensor, and supplies the readout control voltage as the reference voltage to the voltage switch.

10. A synthesizer according to claim 8, further comprising a bandgap reference circuit which receives an external voltage, changes a temperature into a value corresponding to an ambient temperature of the voltage controlled oscillator, and supplies the value as the reference voltage to the voltage switch.

11. A synthesizer according to claim 8, wherein letting T be a measurement time of the counter, a measurement error 2/T of the counter is smaller than an adjustable frequency step given by the control signal in the voltage controlled oscillator.

* * * * *